(12) United States Patent
Ichikawa et al.

(10) Patent No.: US 9,472,735 B2
(45) Date of Patent: Oct. 18, 2016

(54) LIGHT-EMITTING DEVICE

(71) Applicant: NICHIA CORPORATION, Anan-shi (JP)

(72) Inventors: Hirofumi Ichikawa, Tokushima (JP); Motohisa Kitani, Tokushima (JP); Junya Narita, Yoshinogawa (JP); Keisuke Kurashita, Anan (JP); Takanori Akaishi, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/015,130

(22) Filed: Feb. 4, 2016

(65) Prior Publication Data

US 2016/0233388 A1    Aug. 11, 2016

(30) Foreign Application Priority Data

Feb. 5, 2015   (JP) .................................. 2015-021009

(51) Int. Cl.
| | |
|---|---|
| *H01L 33/00* | (2010.01) |
| *H01L 21/00* | (2006.01) |
| *H01L 33/50* | (2010.01) |
| *H01L 33/48* | (2010.01) |
| *H01L 33/20* | (2010.01) |

(52) U.S. Cl.
CPC ............ *H01L 33/505* (2013.01); *H01L 33/20* (2013.01); *H01L 33/486* (2013.01)

(58) Field of Classification Search
CPC ............................ H01L 33/505; H01L 33/20
USPC .................................. 257/98, 99; 438/29–31
See application file for complete search history.

(56) References Cited

U.S. PATENT DOCUMENTS

| | | | | |
|---|---|---|---|---|
| 7,338,823 B2* | 3/2008 | Han | ..................... | H01L 33/486 |
| | | | | 438/29 |
| 7,527,400 B2* | 5/2009 | Yamamoto | .............. | F21V 15/01 |
| | | | | 257/98 |

FOREIGN PATENT DOCUMENTS

| | | |
|---|---|---|
| JP | 11-340576 | 12/1999 |
| JP | 2005-005433 | 1/2005 |
| JP | 2006-135309 | 5/2006 |
| JP | 2006-203058 | 8/2006 |
| JP | 2006-222248 | 8/2006 |
| JP | 2008-016565 | 1/2008 |
| JP | 2008-072074 | 3/2008 |
| JP | 2009-071174 | 4/2009 |
| JP | 2011-233808 | 11/2011 |
| JP | 2012-023249 | 2/2012 |

\* cited by examiner

*Primary Examiner* — Calvin Lee
(74) *Attorney, Agent, or Firm* — Mori & Ward, LLP

(57) ABSTRACT

A light-emitting device includes a package and at least one light-emitting element. The package includes a concave portion which has a bottom surface. The bottom surface includes sides, package distances between opposite sides among the sides, a longest package distance among the package distances, a lower side among the sides, and an upper side among the sides opposite to the lower side. The at least one light-emitting element is arranged on the bottom surface of the concave portion and has a polygonal shape viewed along a front direction. The polygonal shape has light-emitting element distances between vertexes of the polygonal shape and has a longest light-emitting element distance among the light-emitting element distances. The at least one light-emitting element is arranged such that a light-emitting element lateral line along the longest light-emitting element distance is substantially parallel to a package lateral line along the longest package distance.

16 Claims, 15 Drawing Sheets

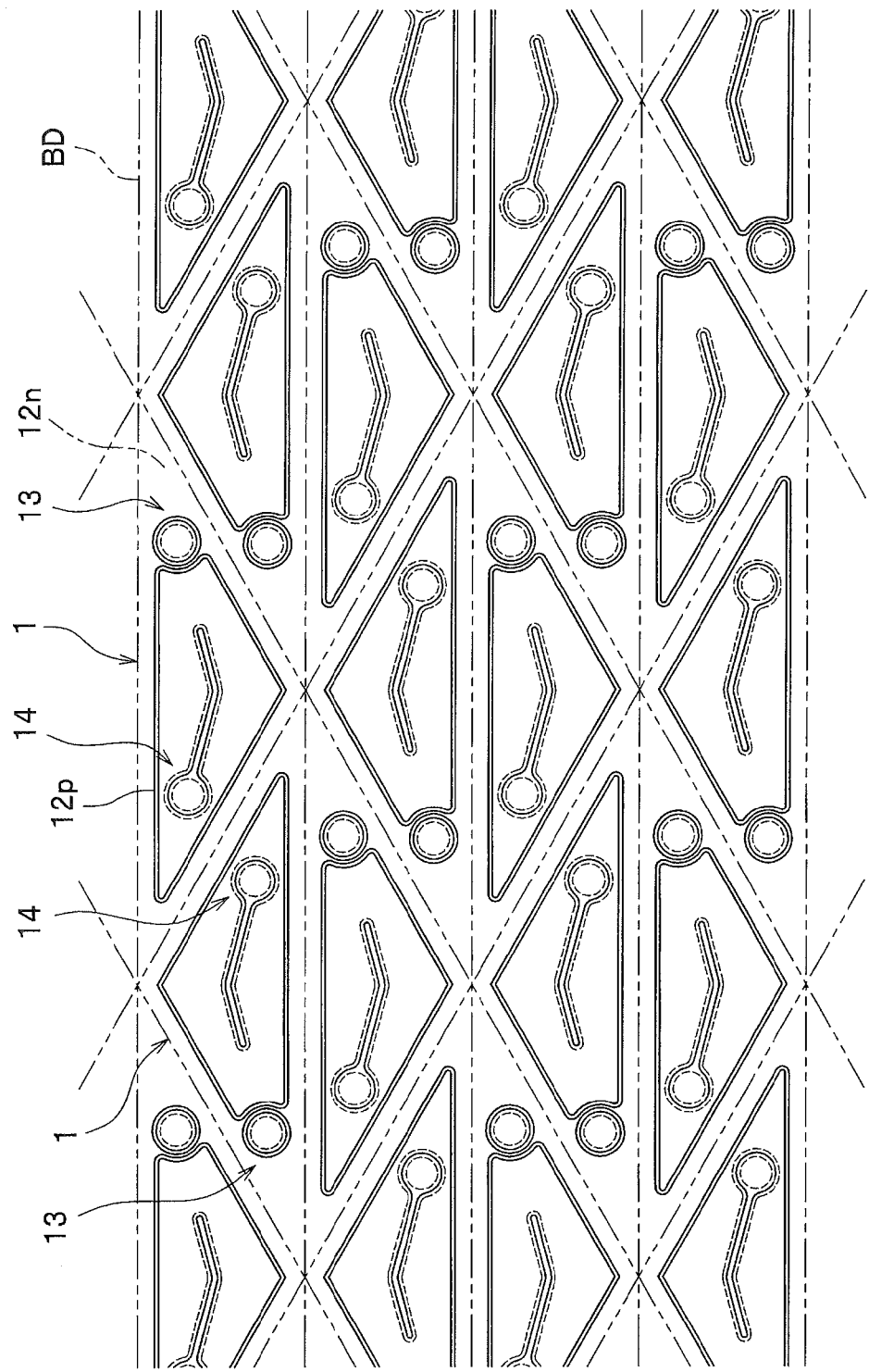

LIGHT-EMITTING DEVICE

CROSS-REFERENCE TO RELATED APPLICATION

The present application claims priority under 35 U.S.C. §119 to Japanese Patent Application No. 2015-021009, filed Feb. 5, 2015. The contents of this application are incorporated herein by reference in their entirety.

BACKGROUND

1. Technical Field

The present invention relates to a light-emitting device.

2. Description of Related Art

As for light-emitting devices in which semiconductor light-emitting elements such as light-emitting diodes "LEDs" are employed, the demands for miniaturization, an increase in high efficiency of light extraction, and high reliability along with an increase in power output have been grown in the markets for backlights, light fixtures, and vehicle lights. In particular, as for side-view type light-emitting devices, demands for high efficiency and high power output, along with reduction in size and thickness, have been intensifying.

As the side-view type light-emitting devices, one device has been disclosed in which light-emitting elements are mounted in a concave portion of a resin package, and light emitted from the opening of the concave portion of the resin package is used as illumination light. In the light-emitting device having the aforementioned constitution, in a case where the height of the opening of the concave portion of the resin package is decreased so as to reduce thickness, a distance between the lateral surface of the light-emitting element and the inner surface of the concave portion of the resin package is shortened, which causes the light having high intensity to be irradiated to the inner lateral surface of the concave portion of the resin package. Accordingly, the resin package is degenerated due to the light from the light-emitting element, which is likely to cause discoloration or cracks. As a result, this leads to reduction in reliability inclusive of the life of the light-emitting device. Also, in the case where the light-emitting element is mounted with solder on the lower surface side of the resin package as a mounting surface, internal stress is generated on the mounting surface and resin on the side opposite to the mounting surface, which is likely to cause the cracks on the upper surface side of the resin package in using the light-emitting element after mounting.

For example, Japanese Unexamined Patent Application Publication No. 2005-5433 A discloses a light semiconductor device "light-emitting device" in which one or plural light-emitting elements, whose shape is square in the case of being viewed from a plane, are arranged in the concave portion of the resin package in the direction that each light-emitting element is rotated about an axis vertical to an arrangement surface at 45 degrees. With this arrangement, the intensity of light from the light-emitting elements, which irradiates to the inner surface of the concave portion of the resin package, can be reduced.

SUMMARY

According to one aspect of the present invention, a light-emitting device includes a package and at least one light-emitting element. The package includes a concave portion which has a bottom surface, an opening on a front side opposite to the bottom surface in a front direction vertical to the bottom surface, and an inner peripheral wall connecting the bottom surface and the front side. The bottom surface includes sides, package distances between opposite sides among the sides, a longest package distance among the package distances, a mounting wall, a lower side among the sides, and an upper side among the sides opposite to the lower side. The light-emitting device is mounted via the mounting wall. The lower side defines a part of the mounting wall. The at least one light-emitting element is arranged on the bottom surface of the concave portion and has a polygonal shape viewed along the front direction. Each interior angle of the polygonal shape is less than 180 degrees. The polygonal shape has light-emitting element distances between vertexes of the polygonal shape and has a longest light-emitting element distance among the light-emitting element distances. The at least one light-emitting element is arranged such that a light-emitting element lateral line along the longest light-emitting element distance is substantially parallel to a package lateral line along the longest package distance and such that a first outer peripheral portion of the at least one light-emitting element which is closest to the upper side of the concave portion is shorter than a second outer peripheral portion of the at least one light-emitting element which is closest to the lower side of the concave portion viewed along the front direction.

According to another aspect of the present invention, a light-emitting device includes a package and at least one light-emitting element. The package includes a concave portion which has a bottom surface, an opening on a front side opposite to the bottom surface in a front direction vertical to the bottom surface, and an inner peripheral wall connecting the bottom surface and the front side. The bottom surface includes sides, package distances between opposite sides among the sides, a longest package distance among the package distances, a mounting wall, a lower side among the sides, and an upper side among the sides opposite to the lower side. The light-emitting device is mounted via the mounting wall. The lower side defines a part of the mounting wall. The at least one light-emitting element is arranged on the bottom surface of the concave portion and has a polygonal shape viewed along the front direction. Each interior angle of the polygonal shape is less than 180 degrees. The polygonal shape has light-emitting element distances between vertexes of the polygonal shape and has a longest light-emitting element distance among the light-emitting element distances. The at least one light-emitting element is arranged such that a light-emitting element lateral line along the longest light-emitting element distance is substantially parallel to a package lateral line along the longest package distance and such that a first outer peripheral portion of the at least one light-emitting element which is closest to the upper side of the concave portion is shorter than a length of a side, of which inclination to the package lateral line is minimum, out of sides of the at least one light-emitting element on a lower-side side of the concave portion viewed along the front direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 7B is a schematic plan view illustrating a state where the light-emitting element is formed on the wafer in the preparatory process of the light-emitting element in the manufacturing method of the light-emitting device according to the first embodiment.

DETAILED DESCRIPTION OF EMBODIMENTS

Figure 1:
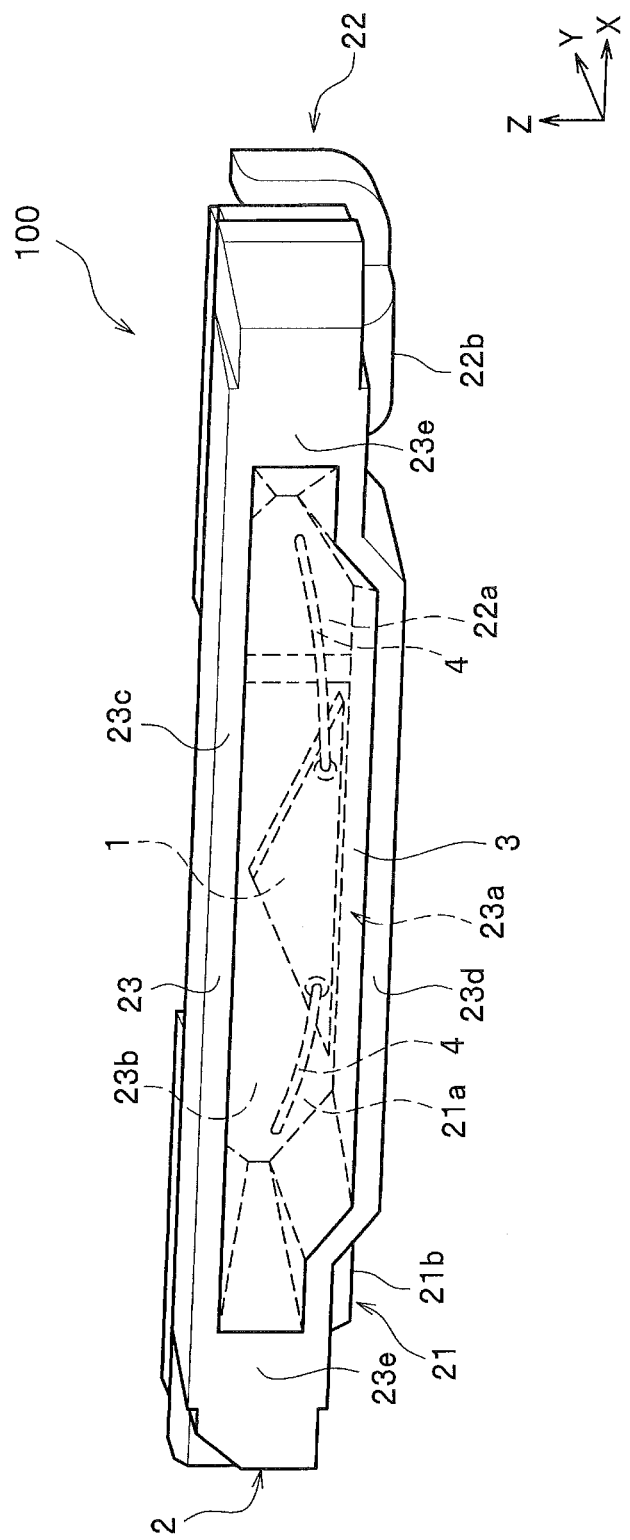
FIG. 1 is a schematic view illustrating the constitution of a light-emitting device according to a first embodiment.

The embodiments will now be described with reference to the accompanying drawings, wherein like reference numerals designate corresponding or identical elements throughout the various drawings.

Hereinafter, a light-emitting device according to the present embodiments and a manufacturing method for the same will be described. It is noted that the drawings referred in the following descriptions schematically represent the embodiments of the present invention. Accordingly, there is a case where the scales, intervals, and positional relation of respective members are exaggerated, or the illustration of part of the members is omitted. Also, for example, there is a case where the scales or intervals of respective members are not corresponded between a plan view and its corresponding cross-sectional view. Also, in the description below, in principle, the same term or reference number represents the same or homogeneous member, and therefore its detailed description is appropriately omitted.

In the light-emitting device according to the present embodiments and the manufacturing method, the terms "up", "down", "right", and "left" are replaced in accordance with the circumstances. In the Description, the terms "up" and "down" represent a relative position between the constitutional members in the drawing that is referred to for the purpose of description, but do not intend to represent an absolute position unless specifically stated otherwise.

First Embodiment

Constitution of Light-Emitting Device

Figure 2A:
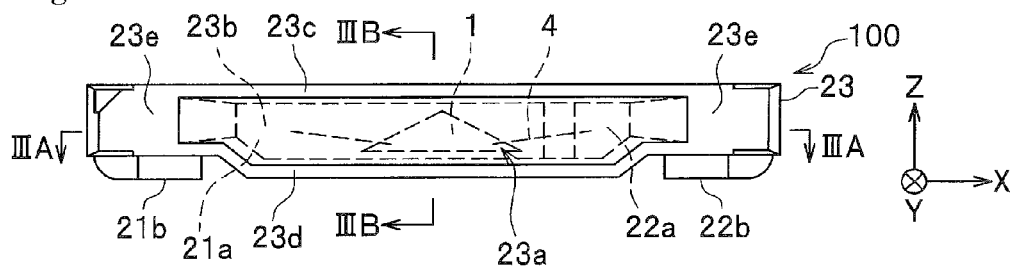
FIG. 2A is a schematic front view illustrating the constitution of the light-emitting device according to the first embodiment.
Figure 2B:
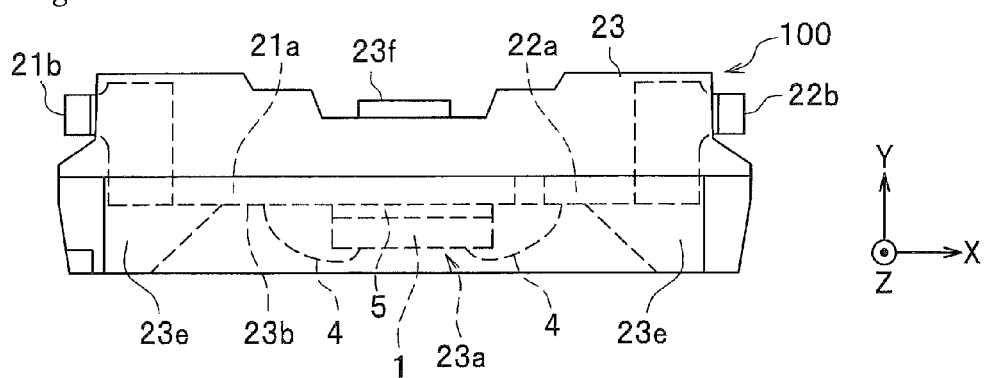
FIG. 2B is a schematic plan view illustrating the constitution of the light-emitting device according to the first embodiment.
Figure 2C:
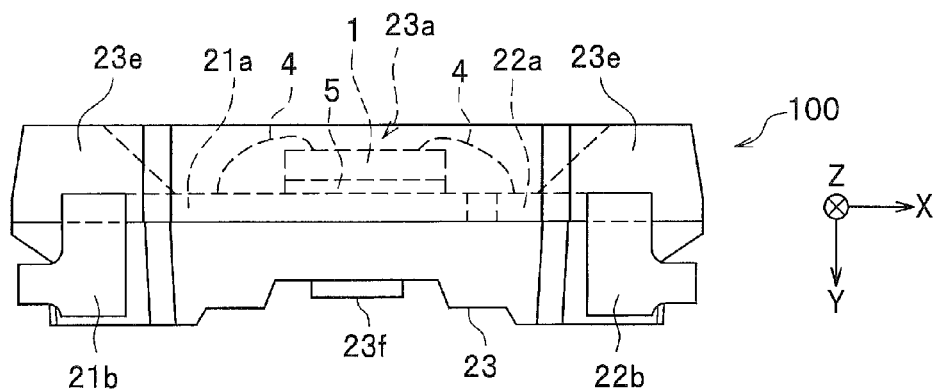
FIG. 2C is a schematic bottom view illustrating the constitution of the light-emitting device according to the first embodiment.
Figure 2D:
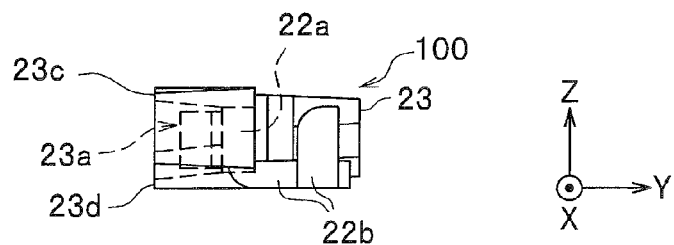
FIG. 2D is a schematic right side view illustrating the constitution of the light-emitting device according to the first embodiment.
Figure 3A:
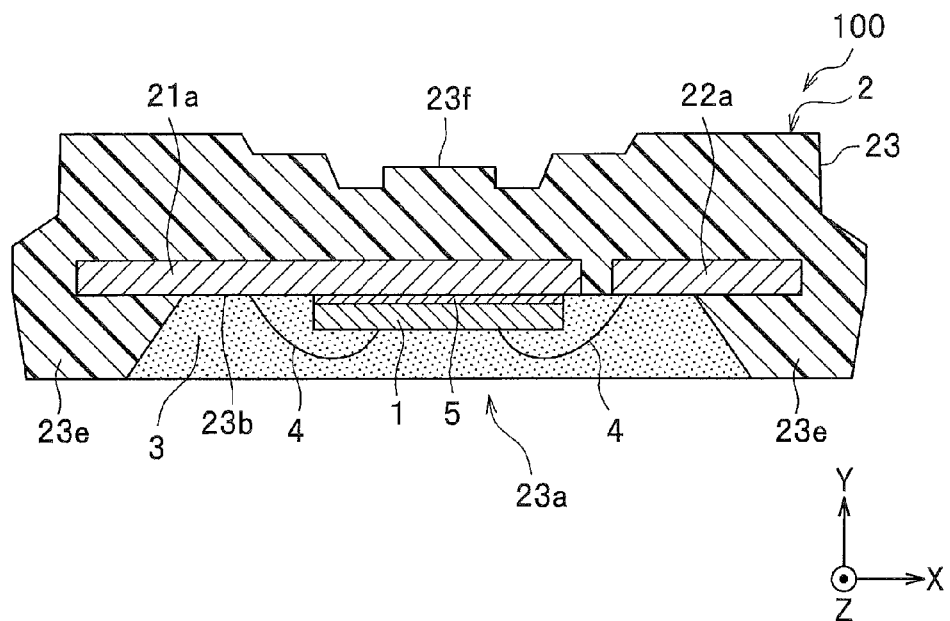
FIG. 3A is a schematic cross-sectional view illustrating the constitution of the light-emitting device according to the first embodiment and a schematic cross-sectional view taken along a line IIIA-IIIA in FIG. 2A.
Figure 3B:
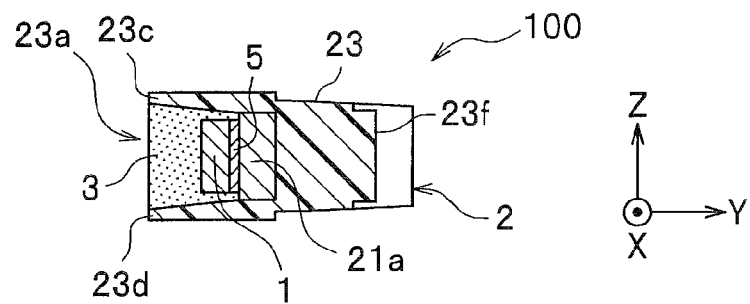
FIG. 3B is a schematic cross-sectional view illustrating the constitution of the light-emitting device according to the first embodiment and a schematic cross-sectional view taken along a line IIIB-IIIB in FIG. 2A.

The constitution of a light-emitting device according to a first embodiment will be described with reference to FIGS. 1 to 3B. FIG. 1 is a schematic view illustrating the constitution of the light-emitting device according to the first embodiment. FIG. 2A is a schematic front view illustrating the constitution of the light-emitting device according to the first embodiment. FIG. 2B is a schematic plan view illustrating the constitution of the light-emitting device according to the first embodiment. FIG. 2C is a schematic bottom view illustrating the constitution of the light-emitting device according to the first embodiment. FIG. 2D is a schematic right side view illustrating the constitution of the light-emitting device according to the first embodiment. FIG. 3A is a schematic cross-sectional view illustrating the constitution of the light-emitting device according to the first embodiment and a schematic cross-sectional view taken along a line IIIA-IIIA in FIG. 2A. FIG. 3B is a schematic cross-sectional view illustrating the constitution of the light-emitting device according to the first embodiment and a schematic cross-sectional view taken along a line IIIB-IIIB in FIG. 2A. It is noted that coordinate axes are illustrated in each drawing of FIGS. 1 to 3B, and for convenience' sake, FIG. 2A viewed to the positive direction of Y axis is a front view, and FIG. 2B viewed to the negative direction of Z axis is a plan view (top view), and FIG. 2C viewed to the positive direction of the Z axis is a bottom view, and FIG. 2D viewed to the negative direction of X axis is a right side view.

A light-emitting device 100 according to the first embodiment includes a light-emitting element 1 and a package 2. The light-emitting element 1 is provided in a concave portion 23a, which has an opening on the front thereof, in a package 2 and electrically connected to internal lead portions 21a and 22a of lead electrodes 21 and 22 with wires 4. The light-emitting element 1 is bonded to a bottom surface 23b of the concave portion 23a with die bond resin 5. Furthermore, sealing resin 3 having light transmissivity is provided in the concave portion 23a, and the light-emitting element 1 is sealed. Also, light emitted by the light-emitting element 1 is irradiated from the opening of the concave portion 23a to a frontal direction (negative direction of Y axis) via the sealing resin 3 having light transmissivity. The light-emitting device 100 is formed in a flat shape in a thickness direction thereof (Z axis direction), for example, in such a manner as to be adapted to a light source for the backlight of a liquid crystal display.

The light-emitting element 1 is bonded to one polarity of the internal lead portion 21a provided on the bottom surface 23b (surface vertical to Y axis) of the concave portion 23a of the package 2 by use of the die bond resin 5. Also, positive and negative pad electrodes (an anode and a cathode) of the light-emitting element 1 are electrically connected to the internal lead portions 21a and 22a corresponding to each polarity with the wires 4 for bonding such as Au, Ag, Cu, and Al. Also, only one light-emitting element 1 is mounted, but a plurality of light-emitting elements 1 may be mounted. The plurality of light-emitting elements may emit the light having same color or colors different from each other.

In the present embodiment, the light-emitting device 100 is of side-view type "side surface emitting type", so that the light-emitting element 1 is mounted in such a manner that the main surface of the substrate 11 of the light-emitting element 1 is orthogonal to the upper surface of the light-emitting device 100. In the case where the constitution of the light-emitting element 1 is described in the Description, viewing the light-emitting element 1 from a plane means observing the light-emitting element 1 from a normal direction of the main surface of the substrate 11 for convenience' sake. Accordingly, in a state where the light-emitting device 100 is mounted, the plane (upper surface) of the light-emitting element 1 means a surface observed in the case of viewing the light-emitting device 100 from a front.

Figure 4A:
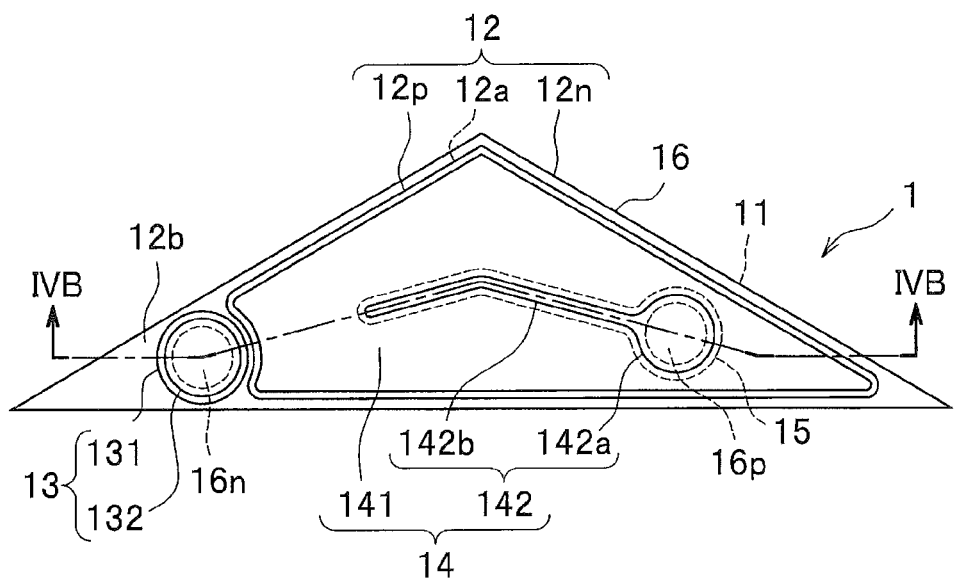
FIG. 4A is a schematic plan view illustrating the constitution of a light-emitting element in the light-emitting device according to the first embodiment.
Figure 4B:
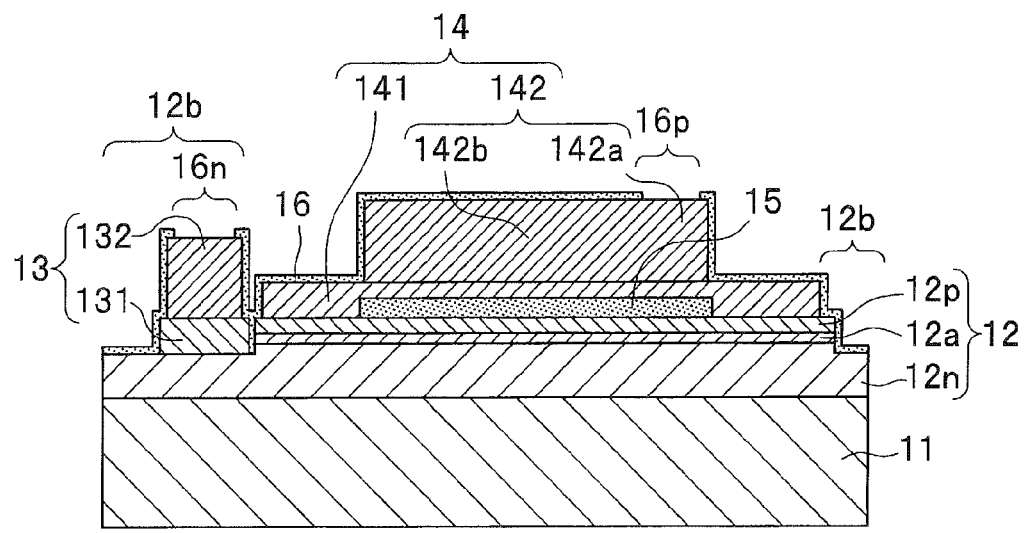
FIG. 4B is a schematic cross-sectional view illustrating the constitution of the light-emitting element in the light-emitting device according to the first embodiment and a schematic cross-sectional view taken along a line IVB-IVB in FIG. 4A.
Figure 4C:
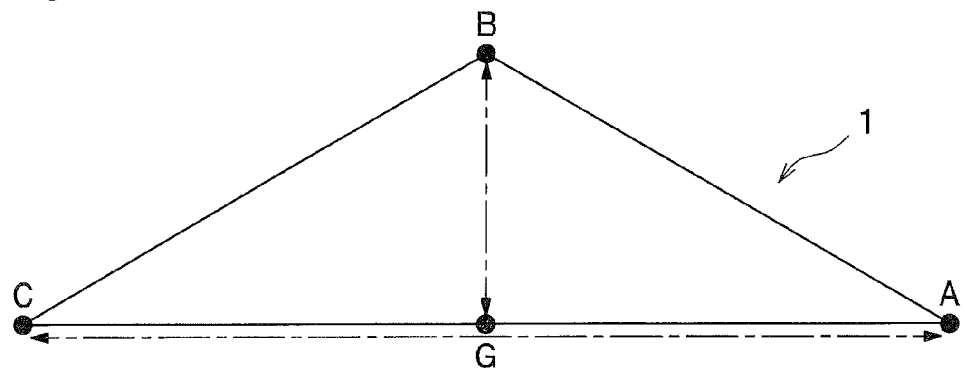
FIG. 4C is a schematic view to describe a shape of the light-emitting element viewed from a plane in the light-emitting device according to the first embodiment.

Herein, the example of the constitution of the light-emitting element 1 will be described with reference to FIGS. 4A to 4C. FIG. 4A is a schematic plan view illustrating the constitution of the light-emitting element in the light-emitting device according to the first embodiment. FIG. 4B is a schematic cross-sectional view illustrating the constitution of the light-emitting element in the light-emitting device according to the first embodiment and a schematic cross-sectional view taken along the line IVB-IVB in FIG. 4A. FIG. 4C is a schematic view to describe a shape of the light-emitting element viewed from a plane in the light-emitting device according to the first embodiment.

The light-emitting element 1 can be preferably used for semiconductor light-emitting elements such as LEDs. The light-emitting element 1 of the present embodiment is formed in a horizontally extended triangle in the case of being viewed from a plane and includes the substrate 11, a semiconductor stacked body 12, an n-side electrode 13, a p-side electrode 14, an insulation film 15, and a protective film 16. Also, the light-emitting element 1 of the present embodiment includes the semiconductor stacked body 12 that includes light-emitting diode structure on one main surface of the substrate 11, and further includes the n-side electrode 13 and the p-side electrode 14 on one surface side of the semiconductor stacked body 12 and has structure suitable for mounting a face-up-type semiconductor stacked body.

The shape of the light-emitting element 1 in the case of being viewed from a plane is a triangle, and as illustrated in FIG. 4C, in the case where three vertexes of the triangle are represented as A, B and C, the lengths of a side AB and a side BC are equal, and the internal angle of the vertex B exceeds 90 degrees, which forms an obtuse isosceles triangle. Also, in the light-emitting element 1, a side CA is regarded as a longitudinal direction, and a perpendicular line BG that is dropped from the vertex B to the side CA is regarded as a lateral direction. Accordingly, the light-emitting element 1 is arranged in such a manner that, on the bottom surface 23b of the concave portion 23a, the side CA is parallel to the longitudinal direction of the bottom surface 23b, and the vertex B is directed opposite to the upper side of the bottom surface 23b. Also, it is preferable that the light-emitting element 1 be arranged in such a manner that a distance between the upper side of the bottom surface 23b and the vertex B is approximately equal to a distance between the lower side of the bottom surface 23b and the side CA. In this manner, the irradiation intensity of light to an upper wall portion 23c corresponding to the upper side of the bottom surface 23b and a lower wall portion 23d corresponding to the lower side can be adequately balanced. In the Description, the case where the longitudinal direction of the light-emitting element 1 and the longitudinal direction of the bottom surface 23b of the concave portion 23a are "parallel" or "approximately parallel" includes a case where an inclined angle to the parallel is within 10 degrees or less.

It is noted that the external shape of the light-emitting element 1 is formed in an obtuse triangle, thereby forming a horizontally extended shape, and the area of the bottom surface 23b of the slim light-emitting device 100 is efficiently used, so that the light-emitting element 1 is preferably arranged. Also, the external shape is formed in an isosceles triangle, so that the light distribution in the horizontal direction of the light-emitting device 100 is bilaterally symmetrical, which is preferable. Further, the external shape of the light-emitting element 1 is not limited to the obtuse isosceles triangle, but a vertical angle may be 90 degrees or less, and the lengths of the side AB and the side BC may be different. Furthermore, the external shape of the light-emitting element 1 is not limited to the triangle, but a convex polygon whose entire internal angles are less than 180 degrees may be applied. The example of another external shapes will be described later.

The substrate 11 is a substrate employed for the epitaxial growth of the semiconductor stacked body 12. As for the substrate 11, for example, in the case where the semiconductor stacked body 12 is formed of a nitride semiconductor such as gallium nitride (GaN), substrates having insulation properties, such as sapphire with any one of C-plane, R-plane, and A-plane as a main surface and spinel ($MgAl_2O_4$), or oxide substrates such as lithium niobate and neodymium gallate that are lattice-bonded to silicon carbide (SiC), ZnS, ZnO, Si, GaAs, diamond, and a nitride semiconductor are included.

The semiconductor stacked body 12 is made up of an n-side semiconductor layer 12n and a p-side semiconductor layer 12p, each of which is stacked on one main surface, which is the upper surface of the substrate 11, and an electric current is conducted between the n-side electrode 13 and the p-side electrode 14, thereby emitting light. It is preferable that the semiconductor stacked body 12 include an active layer 12a between the n-side semiconductor layer 12n and the p-side semiconductor layer 12p.

An area where the p-side semiconductor layer 12p and the active layer 12a do not exist in part, that is, a stepped portion 12b where the surface of the p-side semiconductor layer 12p is depressed is formed in the semiconductor stacked body 12. The bottom surface of the stepped portion 12b is constituted of the n-side semiconductor layer 12n. In the present embodiment, the stepped portion 12b is provided on the outer edge portion of the light-emitting element 1, and the stepped portion 12b is widely provided with respect to other portions in a left end portion. The n-side electrode 13 is provided on part of the bottom surface of the stepped portion 12b provided in the left end portion and electrically connected to the n-side semiconductor layer 12n.

A light transmissive electrode 141 is provided as a lower layer portion of the p-side electrode 14 approximately on the entire upper surface of the p-side semiconductor layer 12p, and furthermore a pad electrode 142 is provided on part of the upper surface of the light transmissive electrode 141. Also, the insulation film 15 is provided between the p-side semiconductor layer 12p and the light transmissive electrode 141 in an area immediately below the area where the pad electrode 142 is arranged and its neighborhood area in the case of being viewed from a plane. Further, the surfaces of the semiconductor stacked body 12, the n-side electrode 13, and the p-side electrode 14 are covered with the protective film 16, except for the external connection portions of a pad electrode 132 and the pad electrode 142.

Semiconductor stacked bodies, in which semiconductors such as ZnS, SiC, GaN, GaP, InN, AlN, ZnSe, GaAsP, GaAlAs, InGaN, GaAlN, AlInGaP, and AlInGaN are stacked on the substrate and formed by a liquid phase epitaxy, an HDVPE method, or an MOCVD method, are preferably employed as the semiconductor stacked body 12. As semiconductor materials, various wavelengths of emission light ranging from ultraviolet light to infrared light can be selected based on the selection of mixed crystal degree, so that gallium nitride based semiconductors represented by $In_XAl_YGa_{1-X-Y}N$ ($0 \leq X$, $0 \leq Y$, $X+Y<1$) can be more preferably employed.

The n-side electrode 13 is provided in such a manner as to electrically connect the n-side semiconductor layer 12n on the bottom surface of the stepped portion 12b of the semiconductor stacked body 12 and provided on a negative electrode side as an electrode for supplying an electric current from the outside to the light-emitting element 1. Also, the n-side electrode 13 has structure in which a light reflection film 131 and the pad electrode 132 are stacked. The light reflection film 131 on the lower layer side reflects light that is transmitted in the semiconductor stacked body 12 and incident on the lower surface of the n-side electrode 13, thereby suppressing light absorption by the n-side electrode 13 and enhancing the efficiency of light extraction to the outside. Accordingly, it is preferable that the light reflection film 131 have better light reflectivity than at least that of the lower surface of the pad electrode 132, with respect to the wavelengths of light emitted from the semiconductor stacked body 12. For example, the light reflection film 131 can be formed of Al, Ru, Ag, Ti, Ni, or an alloy for which the main ingredient is made of any of the aforementioned metal.

The pad electrode 132 on the upper layer side is a layer for connecting a power supply to the outside. The pad electrode 132 can employ, for example, Cu, Au or an alloy for which the main ingredient is made of any of the aforementioned metal, so as to be adapted for connection to the outside, such as wire bonding.

The p-side electrode 14 is provided in such a manner as to electrically connect the p-side semiconductor layer 12p on the upper surface of the p-side semiconductor layer 12p and provided on a positive electrode side as an electrode for supplying the electric current from the outside to the light-emitting element 1. Also, the p-side electrode 14 has structure in which the light transmissive electrode 141 and the pad electrode 142 are stacked.

The light transmissive electrode 141 on the lower layer side is provided in such a manner as to cover approximately the entire upper surface of the p-side semiconductor layer 12p. The light transmissive electrode 141 has a function as a current diffusion layer for diffusing the electric current supplied from the outside into the entire surface of the p-side semiconductor layer 12p via the pad electrode 142. Also, the light emitted from the semiconductor stacked body 12 is taken out to the outside primarily via the light transmissive electrode 141. Accordingly, it is preferable that the light transmissive electrode 141 have good light transmissivity with respect to the wavelength of the light emitted by the semiconductor stacked body 12.

The light transmissive electrode 141 is formed of a conductive metal oxide. Oxides inclusive of at least a sort of element selected from a group made of zinc (Zn), indium (In), tin (Sn), gallium (Ga), and titanium (Ti) are included as the conductive metal oxide. Specifically, the conductive metal oxide includes ZnO, ZnO doped with Al (AZO), ZnO doped with In (IZO), ZnO doped with Ga (GZO), $In_2O_3$, $In_2O_3$ doped with Sn (ITO), $In_2O_3$ doped with F (IFO), $SnO_2$, $SnO_2$ doped with Sb (ATO), $SnO_2$ doped with F (FTO), $SnO_2$ doped with Cd (CTO), and $TiO_2$. Among them, ITO is a member that has high light transmissivity with respect to visible light (visible area) and has high conductivity, so that ITO is a suitable member to cover approximately the entire upper surface of the p-side semiconductor layer 12p.

The pad electrode 142 on the upper layer side is provided on part of the upper surface of the light transmissive electrode 141 and is a layer for connecting electrodes on the outside. Also, the pad electrode 142 is constituted of an external connection portion 142a for connecting the outside by use of wire bonding and a stretching portion 142b that stretches from the external connection portion 142a to the n-side electrode 13 by way of the central vicinity of a triangle, which is the external shape in the case of being viewed from a plane and that diffuses the electric current more efficiently.

As is the same with the pad electrode 132 of the n-side electrode 13 described above, the pad electrode 142 can employ, for example, Cu, Au or an alloy for which the main ingredient is made of any of the aforementioned metal, so as to be adapted for connection to the outside, such as wire bonding. In the present embodiment, the pad electrode 142 is such that the external connection portion 142a and the stretching portion 142b both are constituted of a same material.

The insulation film 15 is provided on the p-side semiconductor layer 12p in such a manner as to include the pad electrode 142 in an area immediately below the area where the pad electrode 142 is arranged and its neighborhood area in the case of being viewed from a plane. The insulation film 15 is provided between the p-side semiconductor layer 12p and the light transmissive electrode 141, thereby suppressing the electric current flowing through the p-side semiconductor layer 12p in the area immediately below the pad electrode 142 and thereby suppressing the light emission in the area. Then, the amount of light absorbed by the pad electrode 142 can be reduced by reducing the amount of light transmitted to the pad electrode 142, and as a result, the amount of light emission as the whole of the semiconductor stacked body 12 can be increased.

Also, it is preferable that the insulation film 15 be constituted of a member that has light transmissivity and has a lower refractive index than that of the light transmissive electrode 141. The insulation film 15 is provided on the p-side semiconductor layer 12p, so that the light transmitted upward in the semiconductor stacked body 12 can be totally reflected based on Snell's law on the interface between the p-side semiconductor layer 12p and the insulation film 15. Accordingly, the insulation film 15 is provided in the area immediately below the pad electrode 142 and its neighborhood area in the case of being viewed from a plane, and the light advancing to the pad electrode 142 is efficiently reflected beforehand, thereby reducing the amount of light absorbed by the pad electrode 142.

As the insulation film 15, for example, oxides such as $SiO_2$, $TiO_2$, and $Al_2O_3$, nitrides such as SiN, and fluorides such as MgF can be preferably employed. Among them, $SiO_2$ having a low refractive index can be more preferably employed.

The protective film 16 is a film that has light transmissivity and insulation properties and covers approximately the whole of the upper surface and lateral surface of the light-emitting element 1, except for the lateral surface and lower surface of the substrate 11. Also, the protective film 16 includes an opening portion 16n on the upper surface of the pad electrode 132 and includes an opening portion 16p on the upper surface of the pad electrode 142. As the protective film 16, the same material as that of the aforementioned insulation film 15 can employed, and for example, $SiO_2$ can be preferably employed.

It is noted that, in the light-emitting element 1, the installation areas of the n-side electrode 13, the p-side electrode 14, and the stepped portion 12b and the shapes of the pad electrodes 132 and 142 are not limited to the present embodiment, but may be appropriately modified. Also, the stretching portion may be provided in the n-side electrode 13.

Returning to FIGS. 1 to 3B, the constitution of the light-emitting device 100 will be further described. The package 2 includes the lead electrodes 21 and 22 and a resin portion 23. The external shape of the package 2 is formed in an approximately rectangular parallelepiped that is formed flat in the Z-axis direction, which is the thickness direction of the light-emitting device 100, and suitable for mounting the side-view type light-emitting device that is preferably employed for the light source for the backlight of the liquid crystal display.

The lead electrodes 21 and 22 are a pair of electrodes corresponding to positive and negative polarity. The lead electrodes 21 and 22 are provided on the resin portion 23 and constituted of internal lead portions 21a and 22a for mounting the light-emitting element 1 and external lead portions 21b and 22b that protrude from the bottom surface side of the resin portion 23 and serve as terminals for connecting with a mounting substrate. The lead electrodes 21 and 22 are formed of tabular metal, and may be of an undulating tabular shape or a tubular shape having depressions and projections. The thicknesses of the lead electrodes 21 and 22 may be uniform or may be partially thick or thin.

The internal lead portions 21a and 22a are provided in such a manner as to be exposed from the resin portion 23 on the bottom surface 23b (surface vertical to Y axis) of the concave portion 23a of the resin portion 23. On the bottom surface 23b of the concave portion 23a, the internal lead portion 21a and the internal lead portion 22a are electrically separated from each other. The light-emitting element 1 is bonded to the internal lead portion 21a by use of the die bond resin in a state where the semiconductor stacked body 12 is insulated from the internal lead portion 21a. Also, the n-side electrode 13 and the p-side electrode 14, which are a pair of electrodes of the light-emitting element 1, are electrically connected to the internal lead portions 21a and 22a with corresponding polarities by use of the wires 4 for bonding.

The external lead portions 21b and 22b are successively formed with the internal lead portions 21a and 22a with corresponding polarity and bent in such a manner as to protrude from the bottom surface of the resin portion 23 and stretch on the back surface side (positive direction of Y axis) along the bottom surface of the resin portion 23 and further provided such that parts thereof are bent in such a manner as to stretch upward (positive direction of Z direction) along the right-and-left lateral surfaces of the resin portion 23. The light-emitting device 100 is mounted such that the bottom surface is disposed opposite to the mounting substrate, and the external lead portions 21b and 22b are bonded to wiring patterns of the mounting substrate with conductive adhesive members such as solder.

The materials that constitute the lead electrodes 21 and 22 are not particularly limited, but it is preferable that the lead electrodes 21 and 22 be formed of materials having relatively high heat conductivity. Since the lead electrodes 21 and 22 are formed of the aforementioned materials, heat generated in the light-emitting element 1 can be efficiently dissipated to the outside via the external lead portions 21b and 22b. It is preferable that the materials that constitute the lead electrodes 21 and 22 include, for example, a material having heat conductivity of approximately 200 W/(m·K) or higher, a material having relatively high mechanical strength, or a material suitable for punching press work or etching work. Specifically, metal such as copper, aluminum, gold, silver, tungsten, iron, and nickel, or an iron-nickel alloy, an alloy such as phosphor bronze are included. Also, it is preferable that reflection plating such as Ag having good light reflectivity be applied to the surface exposed on the bottom surface 23b of the concave portion 23a of the internal lead portions 21a and 22a, in order to efficiently take out the light from the light-emitting element 1 to be mounted The resin portion 23 is provided in such a manner as to surround the internal lead portions 21a and 22a and provided as a parent body of the package 2 for supporting the lead electrodes 21 and 22. The external lead portions 21b and 22b continuously formed from the internal lead portions 21a and 22a protrude from the bottom surface of the resin portion 23. The external lead portions 21b and 22b are provided along the bottom surface and the lateral surface of the resin portion 23 while being bent.

The resin portion 23 includes the concave portion 23a that is open on the front side (negative direction of Y axis) of the light-emitting device 100. The internal lead portions 21a and 22a are provided in such a manner as to be exposed on the bottom surface 23b (surface on which the negative direction of Y axis is a normal vector) of the concave portion 23a, and furthermore the light-emitting element 1 is mounted on the surface exposed from the resin portion 23 of the internal lead portion 21a. Also, a gate trace 23f, which is a trace of a gate to inject a resin material into a metal mold in the case of forming the resin portion 23 by an injection molding method, is formed on the back surface of the resin portion 23.

The resin portion 23 is formed of a material in which light reflectivity is given by providing the resin having light transmissivity with the particles of matter having light reflectivity, and functions as a light reflection member that reflects the light from the light-emitting element 1 in the concave portion 23a and efficiently emits the light in the frontal direction. Also, the sealing resin 3 having light transmissivity is filled in the concave portion 23a.

The concave portion 23a includes a horizontally extended opening portion in the case of being viewed from the front. More specifically, an opening is formed in an octagonal shape for which the central portion of a lower side of a rectangle in the case of being viewed from the front is expanded downward in a trapezoidal shape. Also, the bottom surface 23b of the concave portion 23a has a long shape formed in a horizontally extended octagon, and the internal lead portions 21a and 22a are provided on the bottom surface 23b. Also, the concave portion 23a is constituted by being surrounded with an inner wall (an inner peripheral wall) that includes the upper wall portion 23c and the lower wall portion 23d that are provided opposite to each other in the thickness direction (Z-axis direction) of the light-emitting device 100, and two lateral wall portions 23e that are provided opposite to each other in the width direction (X-axis direction) of the light-emitting device 100.

Herein, the upper wall portion 23c and the lower wall portion 23d are thinly formed, compared with the lateral wall portions 23e. Also, parts of the internal lead portions 21a and 22a provided on the bottom surface 23b of the concave portion 23a are provided in such a manner as to extend to the side of the external side surface of the lower wall portion 23d, which is one thin wall portion, protrude from the side of the external side surface as the external lead portions 21b and 22b, which serve as terminals connected to the outside, and further bend and extend along the lower surface of the resin portion 23. Thus, in the light-emitting device 100, the lead electrodes 21 and 22 are provided in order to be adapted to the mounting of the side-view type light-emitting device, and the resin portion 23 is constituted so as to achieve further reduction in thickness of the side-view type light-emitting device 100.

Also, the upper wall portion 23c, the lower wall portion 23d, and the lateral wall portions 23e include inner side surfaces that are inclined in such a manner that the concave portion 23a is spread as it advances from the bottom surface 23b of the concave portion 23a, on which the light-emitting element 1 is mounted, to the opening, in the height direction (Z-axis direction) or the width direction (X-axis direction). Accordingly, the light, which is emitted from the lateral surface (surface parallel to Y axis) of the light-emitting element 1 and transmitted to the inner side surface of the concave portion 23a, is reflected in the frontal direction (negative Y-axis direction) by the inclined inner side surfaces. It is noted that the inner side surfaces of the upper wall portion 23c and the lower wall portion 23d may be constituted of approximately vertical surface with respect to the bottom surface 23b of the concave portion 23a without providing the inclination, so as to achieve thinner structure in terms of the light-emitting device 100.

It is preferable that the resin materials used for the resin portion 23 include good light transmissivity with respect to the wavelength of the light emitted by the light-emitting element 1. For example, the materials include silicone resin, silicone modified resin, silicone hybrid resin, epoxy resin, epoxy modified resin, urea resin, phenol resin, polycarbonate resin, acrylic resin, polymethylpentene resin, polynorbomene resin, polyphthalamide resin, unsaturated polyester resin, polyester resin, liquid crystal resin, polyphenylene ether resin, polyamide resin, or hybrid resin that includes one or more of the aforementioned resins. Among them, unsaturated polyester resin, polyester resin, and polyphthalamide resin excel in light resistance and heat resistance, which is preferable. Polyamide 6T, polyamide 9T, polyamide 10T, polyamide 6C, and polyamide 9C can be used as the polyamide resin. Also, in the side-view type light-emitting device 100, a distance between the light-emitting element 1 and the resin portion 23 is very short, so that the light having high intensity is irradiated to the resin portion 23, which requires light resistance in resin materials. For this reason, in particular, the polyamide resin that does not include a benzene ring in chemical structure, for example, polyamide 6C and polyamide 9C excels in light resistance and heat resistance, which is preferable.

It is preferable that the particles of materials having good light transmissivity be used as the matter having light reflectivity that is contained in the resin portion 23 since there is a great difference in refractive index between the matter having light reflectivity and the aforementioned resin materials. As the matter having light reflectivity, it is preferable that the refractive index, for example, be equal to or higher than 1.8, preferably equal to or higher than 2.0, so as to efficiently diffuse the light and obtain the high efficiency of light extraction, more preferably equal to or higher than 2.5. It is preferable that the difference in refractive index between the resin materials and the matter having light reflectivity, for example, be equal to or higher than 0.4, preferably equal to or higher than 0.7 so as to efficiently diffuse the light and obtain the high efficiency of light extraction, more preferably equal to or higher than 0.9. Also, it is preferable that the average grain diameter of particles of the matter having light reflectivity be equal to or higher than 0.08 µm and equal to or lower than 10 µm, more preferably equal to or higher than 0.1 µm and equal to or lower than 5 µm so as to obtain light scattering effects with high efficiency.

It is noted that, in the Description, the values of the average grain diameter of particles of the matter having light reflectivity or matter of wavelength conversion depend on the observation by use of an electron microscope. As for the particles, a diameter in a constant direction is used to measure a length in a constant axial direction, and a number criterion (number distribution) is used to measure the magnitude of the particles with the electron microscope (SEM, TEM).

The particles of white pigments, specifically, such as $TiO_2$ (titanium oxide), $ZrO_2$ (zirconium oxide), MgO (magnesium oxide), $MgCO_3$ (magnesium carbonate), $Mg(OH)_2$ (magnesium hydroxide), $CaCO_3$ (calcium carbonate), $Ca(OH)_2$ (calcium hydroxide), $CaSiO_3$ (calcium silicate), ZnO (zinc oxide), $BaTiO_3$ (barium titanate), and $Al_2O_3$ (aluminum oxide) can be employed as the matter having light reflectivity. Among them, $TiO_2$ is relatively stable with respect to water and has a high refractive index and excels in heat conductivity, which is preferable. Also, in the case where the light emitted from the light-emitting element 1 is visible light, it is preferable that $TiO_2$ be used as the matter having light reflectivity, so as to obtain better reflectivity, and in the case where the light emitted from the light-emitting element 1 is ultraviolet light, it is preferable that $Al_2O_3$ be used as the matter having light reflectivity.

The aforementioned resin materials contain the matter having light reflectivity in a range that sufficient light reflectivity is obtained, and moldability in the case of forming the shape of the package is not damaged. Accordingly, it is preferable that the content of the matter having light reflectivity contained in the resin portion 23 be equal to or higher than 10 mass percent and equal to or lower than 60 mass percent. The content is set equal to or higher than 10 mass percent, so that the reflectivity of resin can be raised, and the light passing through the resin portion 23 can be reduced, and the efficiency of light extraction of the light-emitting device 100 can be improved. The content is set equal to or lower than 60 mass percent, so that the fluidity of resin is facilitated, and the moldability can be improved. In particular, in the case of the side-view type light-emitting device 100, the lateral walls are thin, which requires high fluidity of resin. It is more preferable that the content of the matter having light reflectivity contained in the resin portion 23 be equal to or higher than 20 mass percent and equal to or lower than 50 mass percent, in order to improve the efficiency of light extraction and the moldability.

The sealing resin 3 is a member for sealing the light-emitting element 1 mounted on the bottom surface 23b of the concave portion 23a, and its main ingredient is made of the resin material having light transmissivity, and the resin material is provided in such a manner as to fill the concave portion 23a of the resin portion 23. Also, the sealing resin 3 may contain the matter of wavelength conversion (phosphor) that converts the light emitted from the light-emitting element 1 into light having different wavelengths. For example, the light-emitting element 1 emits blue light, and the matter of wavelength conversion converts part of the blue light into yellow light, which allows the light-emitting device 100 to emit white light, which is a mixture of the blue light and the yellow light. It is noted that the matter of wavelength conversion contained in the sealing resin 3 may have a plurality of types, or the matter of light diffusion may be contained, in place of or in addition to the matter of wavelength conversion.

It is preferable that the sealing resin 3 be made of materials having good light transmissivity with respect to the wavelength of the light emitted by the light-emitting element 1 and the wavelength of the light emitted by the aforementioned matter of wavelength conversion and having good weather resistance, light resistance, and heat resistance as the sealing resin. As the materials described above, the resin material or glass similar to those of the resin portion 23 can be used. As the materials of the sealing resin 3, for example, silicone resin, silicone modified resin, silicone hybrid resin, fluorine resin, fluorine modified resin, and adamantane resin are included. In particular, the silicone resin and the fluorine resin, which excel in light resistance and heat resistance, are preferable.

Also, as the matter of wavelength conversion (phosphor), substances known in this field can be employed. For example, the substances include yttrium aluminum garnet (YAG) based phosphor based phosphor activated by cerium that emits green to yellow light, lutetium aluminum garnet (LAG) based phosphor based phosphor activated by cerium that emits green light, nitrogen-containing calcium aluminosilicate ($CaO$—$Al_2O_3$—$SiO_2$) based phosphor activated by europium and/or chromium that emits green to red light, silicate ($(Sr, Ba)_2SiO_4$) based phosphor activated by europium that emits blue to red light, $(Si, Al)_6 (O, N)_8$ that emits green light: β sialon phosphor represented by Eu, $SrGa_2S_4$: sulfide based phosphor represented by Eu, $CaAlSiN_3$ that emits red light: CASN based phosphor represented by Eu or (Sr, Ca)$AlSiN_3$: nitride based phosphor such as SCASN based phosphor represented by Eu, KSF ($K_2SiF_6$: Mn) based phosphor that emits red light, and sulfide based phosphor that emits red light.

Also, the particles of white pigments, specifically, such as $SiO_2$, $TiO_2$, $ZrO_2$, MgO, $MgCO_3$, $Mg(OH)_2$, $CaCO_3$, $Ca(OH)_2$, $CaSiO_3$, ZnO, $BaTiO_3$, and $Al_2O_3$ can be employed as the matter of light diffusion contained in the sealing resin 3. Among them, $TiO_2$ is relatively stable with respect to water and has a high refractive index and excels in heat conductivity, which is preferable. Also, in the case where the light emitted from the light-emitting element 1 is visible light, it is preferable that $TiO_2$ be used as the matter of light diffusion, so as to obtain better light scattering properties, and in the case where the light emitted from the light-emitting element 1 is ultraviolet light, it is preferable that $Al_2O_3$ be used as the matter of light diffusion.

It is preferable that the average grain diameter of particles of the matter of light diffusion contained in the sealing resin 3 be equal to or higher than 0.001 µm and equal to or lower than 10 µm, thereby acquiring the high efficiency of light scattering properties. In particular, it is preferable that the average grain diameter of particles of the matter of light diffusion in the sealing resin 3 be from 0.001 µm to 0.05 µm. Accordingly, a high light scattering effect, that is, Rayleigh scattering effect can be obtained, thereby enhancing the efficiency of light extraction as the light-emitting device 100. Also, the particles of the matter of light diffusion, whose average grain diameter preferably ranges from 0.001 µm to 0.05 µm, and the aforementioned matter of wavelength conversion, in particular, nitride based phosphor such as CASN based phosphor and SCASN based phosphor, fluoride based phosphor such as KSF based phosphor, or sulfide based phosphor, are used in combination, so that the efficiency of light extraction can be improved. Further, the efficiency of light extraction is improved, and an increase in temperature due to the generated heat of the matter of wavelength conversion can be suppressed by reducing the amount of matter of wavelength conversion to be used, so that the deterioration of the phosphor can be reduced, and the reliability of the light-emitting device 100 can be improved. In particular, the light-emitting element 1 is formed in a polygonal dice, and the light-emitting device 100, which includes sulfide based, fluoride based or nitride based phosphor as the matter of wavelength conversion, and the matter of light diffusion whose average grain diameter preferably ranges from 0.001 µm to 10 µm, can reduce the deterioration of the sealing resin 3 and the phosphor and improve the efficiency of light extraction.

The wires 4 electrically connect the pad electrode 132 of the n-side electrode 13 and the pad electrode 142 of the p-side electrode 14 of the light-emitting element 1 to the internal lead portions 21a and 22a corresponding to each polarity. The wires 4 can be formed of, preferably, Au, Cu, Al, Ag, or an alloy for which the main ingredient is made of any of the aforementioned metal.

The die bond resin 5 is a bonding member for bonding the light-emitting element 1 with the internal lead portion 21a provided on the bottom surface 23b of the concave portion 23a. It is preferable that the die bond resin 5 be made of resin materials that hardly involve change in color or deterioration due to the light or heat emitted by the light-emitting element 1, and that more preferably have good light transmissivity and a refractive index equal to or less than that of the sealing resin 3. Since the refractive index of the die bond resin 5 is set equal to or less than that of the sealing resin 3, the light emitted from the light-emitting element 1 via the die bond resin 5 can be efficiently taken out to the outside without being totally reflected on an interface between the die bond resin 5 and the sealing resin 3. As the aforementioned resin materials, it is preferable that silicone based die bond resin having siloxane frameworks be employed. The silicone based die bond resin includes silicone resin, silicone hybrid resin, and silicone modified resin.

Operation of Light-Emitting Device

Figure 5:
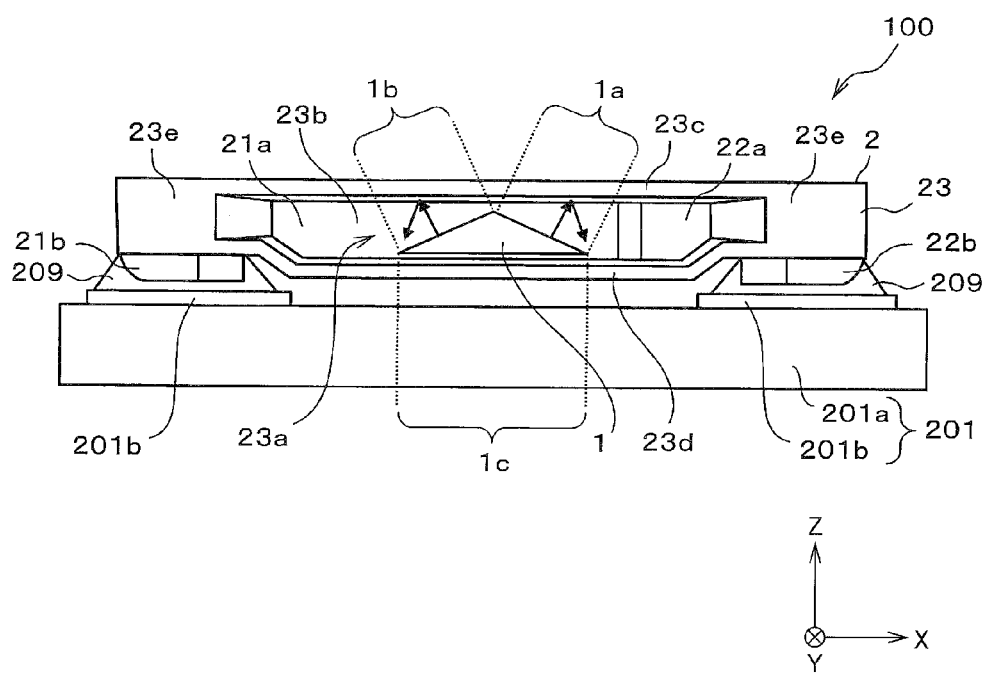
FIG. 5 is a schematic front view to describe light extraction from the lateral side of the light-emitting element in the light-emitting device mounted on a mounting substrate according to the first embodiment.

Next, the operation of the light-emitting device 100 will be described referring to FIGS. 2A to 5. FIG. 5 is a front view to describe the light extraction from the lateral side of the light-emitting element in the light-emitting device mounted on the mounting substrate according to the first embodiment. In FIG. 5, the descriptions of the wires 4 and the detailed structure of the light-emitting element 1 are omitted. It is noted that, for convenience' sake, it is assumed that the light-emitting element 1 emits blue light, and the matter of wavelength conversion, which absorbs the blue light and emits yellow light, is contained in the sealing resin 3.

In the case where the light-emitting device 100 is connected to an external power supply via the external lead portions 21b and 22b, the electric current is supplied to the light-emitting element 1 via the internal lead portions 21a and 22a and the wires 4, and the light-emitting element 1 emits the blue light. Part of the blue light emitted by the light-emitting element 1 is converted into the yellow light by the matter of wavelength conversion in the case where the blue light is transmitted to the sealing resin 3. Then, part of the light is reflected by the interfaces of respective members inclusive of the light-emitting element 1 provided in the concave portion 23a, the die bond resin 5, the internal lead portions 21a and 22a, the resin portion 23, and the sealing resin 3 and emitted from the opening surface of the concave portion 23a of the package 2 as the white light in which the blue light and the yellow light are mixed while part of the light is absorbed.

More specifically, the light emitted from the lateral surface of the light-emitting element 1 and transmitted in the vertical direction (Z-axis direction) or the horizontal direction (X-axis direction) in the sealing resin 3 is irradiated to the upper wall portion 23c, the lower wall portion 23d, or the lateral wall portions 23e. Part of the light is reflected in the front direction (negative direction of Y axis). Also, the light advancing to the bottom surface 23b of the concave portion 23a in the light-emitting element 1 is reflected on the interface between the substrate 11 and the die bond resin 5 or the bottom surface 23b of the concave portion 23a, which causes part of the light to return into the light-emitting element 1 and causes part of the light to transmit in the horizontal direction in the die bond resin 5 and to be taken out to the outside via the sealing resin 3.

Also, part of the light irradiated to the upper wall portion 23c, the lower wall portion 23d, and the lateral wall portions 23e is absorbed by the upper wall portion 23c, the lower wall portion 23d, or the lateral wall portions 23e. In particular, in the thin package 2, a distance between the lateral surface of the light-emitting element 1, and the upper wall portion 23c and the lower wall portion 23d cannot be expanded, which causes an increase in irradiation intensity with respect to the upper wall portion 23c and the lower wall portion 23d. Then, the amount of light absorbed increases in accordance with the irradiation intensity, so that, in particular, the upper wall portion 23c and the lower wall portion 23d are likely to deteriorate.

Also, the light-emitting device 100 is mounted on a mounting substrate 201 on which wiring patterns 201b are provided on the surface of a tabular substrate 201a. In this time, the external lead portions 21b and 22b provided on the lower surface side of the package 2 and the wiring patterns 201b are bonded by use of a bonding member 209 such as solder. Accordingly, great internal stress is generated on the upper wall portion 23c, compared with the lower wall portion 23d, so that cracks are likely to occur on the upper wall portion 23c due to the deterioration of the resin materials, which is caused by the light irradiation.

In FIG. 5 illustrating the arrangement in the case of being viewed from the front, the light-emitting element 1 is arranged in such a manner that a side 1c (side CA), which is the longitudinal direction of the triangular external shape, is in parallel with the longitudinal direction of the bottom surface 23b of the concave portion 23a, and a side 1a (side AB) and a side 1b (side BC) are opposed in non-parallel with the upper side of the bottom surface 23b of the concave portion 23a, and the side 1c (side CA) is opposed in parallel to the lower side of the bottom surface 23b of the concave portion 23a.

The irradiation intensity of the light irradiated from the lateral surface corresponding to the sides 1a and 1b of the light-emitting element 1, which are provided in such a manner as to be in non-parallel with the upper side of the bottom surface 23b, to the inner side surface of the upper wall portion 23c, can be reduced only by the corresponding amount of inclination, with respect to the irradiation intensity of the light irradiated from the lateral surface corresponding to the side 1c of the light-emitting element 1, which is provided in such a manner as to be in parallel with the lower side of the bottom surface 23b, to the inner side surface of the lower wall portion 23d.

Also, the light irradiated from the lateral surface corresponding to the sides 1a and 1b to the inner side surface of the upper wall portion 23c has many components reflected in an oblique direction with respect to the lateral surface corresponding to the sides 1a and 1b on the inner side surface, so that the ratio of repeating the reflection between the lateral surface of the light-emitting element 1 and the inner side surface of the upper wall portion 23c can be reduced, and the light can be easily outputted to the outside.

Furthermore, as the distance between the lateral surface of the light-emitting element 1 and the inner side surface of the upper wall portion 23c increases, in the case where the light transmits in the sealing resin 3 disposed between the lateral surface of the light-emitting element 1 and the inner side surface of the upper wall portion 23c, the light is converted by the matter of wavelength conversion or diffused by the matter of light diffusion, so that the irradiation intensity of the light irradiated to the upper wall portion 23c is further reduced.

Thus, the irradiation intensity of the light irradiated to the upper wall portion 23c is reduced, so that the deterioration of the resin material can be suppressed, and the occurrence of the cracks can be prevented. As a result, the prolongation of life spans of the light-emitting device 100 can be achieved. Also, in place of or in addition to the prolongation of life spans, an increase in power output of the light-emitting device 100 can be achieved.

Also, with regard to the lower wall portion 23d in which the cracks hardly occur, from the relative viewpoint, the light-emitting element 1 is arranged in such a manner that the side 1c opposite to the lower side of the bottom surface 23b of the external shape of the light-emitting element 1 is parallel to the lower side, thereby increasing the ratio of the area of the light-emitting element 1 per area required for installation, compared with the case where the light-emitting element, whose external shape is a square, is arranged downward in such a manner as to rotate about the axis vertical to the main surface at 45 degrees.

That is, in the perspective of the area, the mounting efficiency of the light-emitting element 1 in the mounting area of the package 2 can be improved by means of the external shape of the light-emitting element 1 and the arrangement of the light-emitting element 1 into the concave portion 23a. Accordingly, while the package 2 is of a small size or of a thin type as heretofore packages, an increase in power output of the light-emitting device 100 can be achieved. Also, in place of or in addition to high power output of the light-emitting device 100, the miniaturization or the slimming down of the light-emitting device 100 can be achieved better than heretofore.

Manufacturing Method of Light-Emitting Device

Figure 6A:
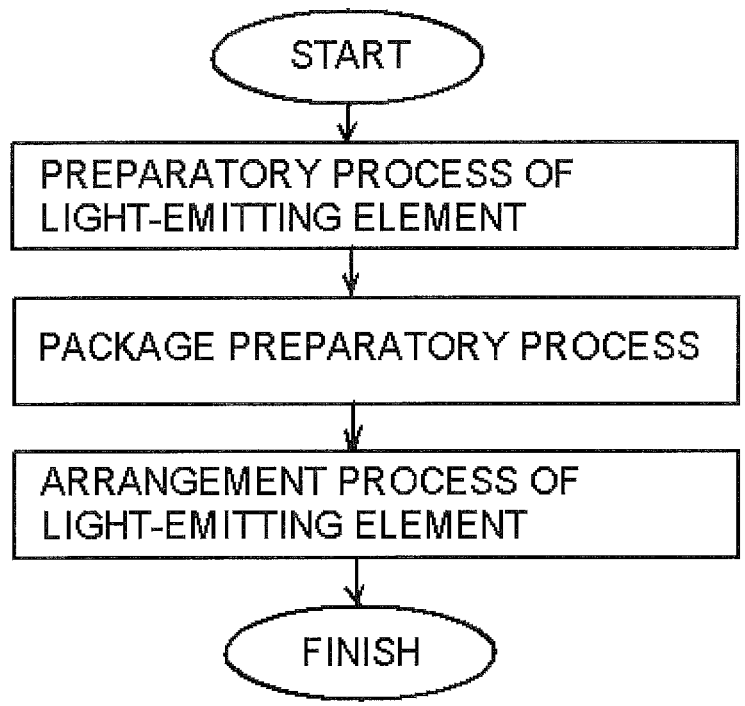
FIG. 6A is a flowchart illustrating the procedure of a manufacturing method of the light-emitting device according to the first embodiment.
Figure 6B:
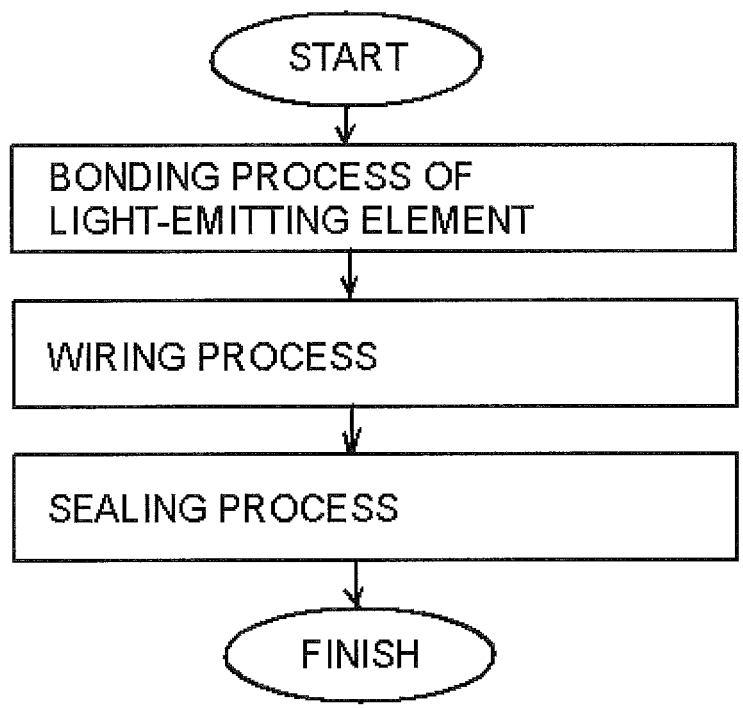
FIG. 6B is a flowchart illustrating the details of an arrangement process of the light-emitting element in the manufacturing method of the light-emitting device according to the first embodiment.
Figure 7A:
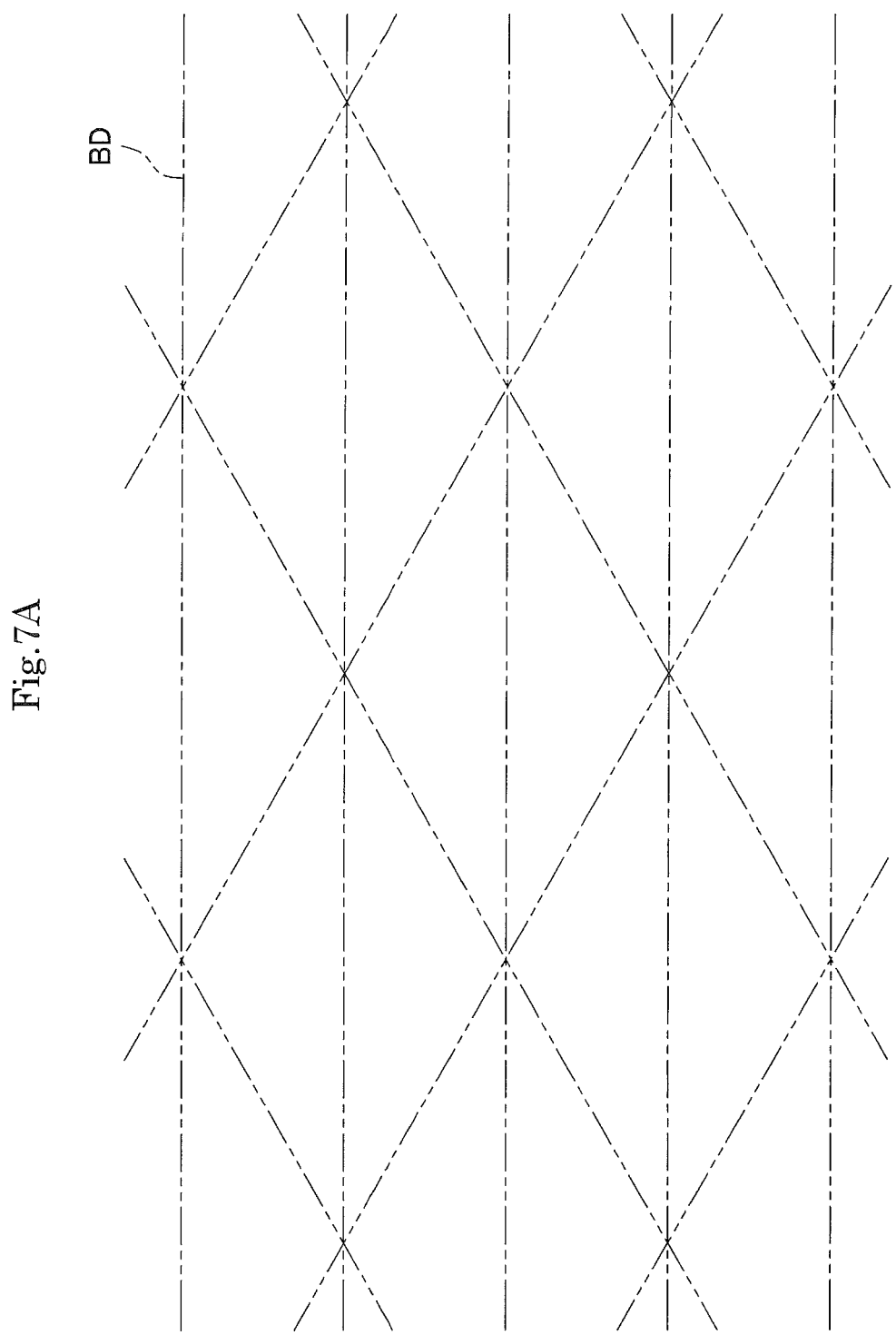
FIG. 7A is a schematic plan view illustrating a boundary line that virtually partitions a wafer in a preparatory process of the light-emitting element in the manufacturing method of the light-emitting device according to the first embodiment.
Figure 8A:
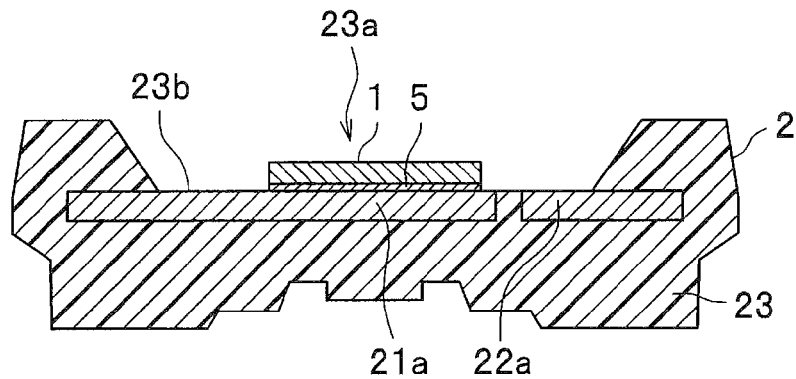
FIG. 8A is a schematic cross-sectional view illustrating a bonding process of the light-emitting element, which is a sub-process, in the arrangement process of the light-emitting element in the manufacturing method of the light-emitting device according to the first embodiment.
Figure 8B:
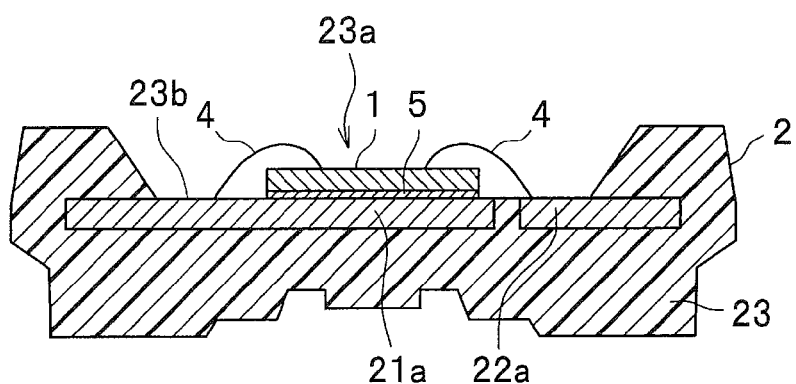
FIG. 8B is a schematic cross-sectional view illustrating a wiring process, which is a sub-process, in the arrangement process of the light-emitting element in the manufacturing method of the light-emitting device according to the first embodiment.
Figure 8C:
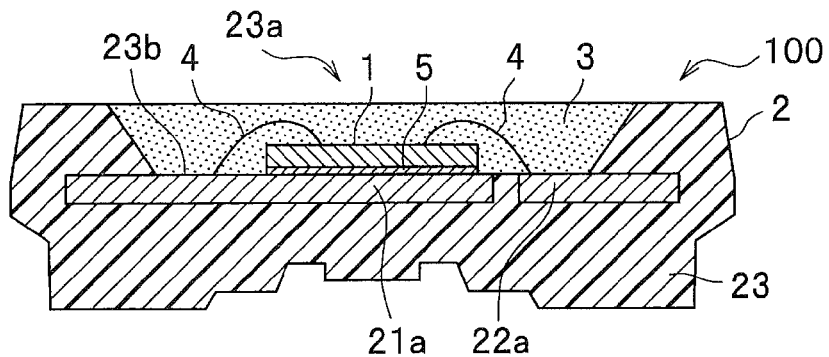
FIG. 8C is a schematic cross-sectional view illustrating a sealing process, which is a sub-process, in the arrangement process of the light-emitting element in the manufacturing method of the light-emitting device according to the first embodiment.

Next, the manufacturing method of the light-emitting device 100 will be described referring to FIGS. 6A to 8C. FIG. 6A is a flowchart illustrating the procedure of the manufacturing method of the light-emitting device according to the first embodiment. FIG. 6B is a flowchart illustrating the details of an arrangement process of the light-emitting element in the manufacturing method of the light-emitting device according to the first embodiment. FIG. 7A is a schematic plan view illustrating a boundary line that virtually partitions a wafer in a preparatory process of the light-emitting element in the manufacturing method of the light-emitting device according to the first embodiment. FIG. 7B is a schematic plan view illustrating a state where the light-emitting element is formed on the wafer in the preparatory process of the light-emitting element in the manufacturing method of the light-emitting device according to the first embodiment. FIG. 8A is a schematic cross-sectional view illustrating a bonding process of the light-emitting element, which is a sub-process, in the arrangement process of the light-emitting element in the manufacturing method of the light-emitting device according to the first embodiment. FIG. 8B is a schematic cross-sectional view illustrating a wiring process, which is a sub-process, in the arrangement process of the light-emitting element in the manufacturing method of the light-emitting device according to the first embodiment. FIG. 8C is a schematic cross-sectional view illustrating a sealing process, which is a sub-process, in the arrangement process of the light-emitting element in the manufacturing method of the light-emitting device according to the first embodiment.

Manufacturing Method of Light-Emitting Device

The manufacturing method of the light-emitting device 100 according to the first embodiment includes a light-emitting-element preparatory process S101, a package preparatory process S102, and a light-emitting-element arrangement process S103.

The light-emitting-element preparatory process S101 is a process of preparing the light-emitting elements 1 that have the constitution illustrated in FIGS. 4A to 4C and are individually separated. Hereinafter, the example of processes of manufacturing the light-emitting elements 1 in wafer level process is described, but not limited to this. In the case where the light-emitting elements 1 are manufactured in the wafer level process, for example, as illustrated in FIG. 7A, a boundary line BD, which is a virtual line that partitions individual light-emitting elements 1, is defined, and the plurality of light-emitting elements 1 having a same shape are formed.

Forming Semiconductor Stacked Body

Specifically, first, the semiconductor stacked body 12, on which the n-side semiconductor layer 12n, the active layer 12a, and the p-side semiconductor layer 12p are sequentially stacked, is formed on the substrate 11 such as sapphire by the MOCVD method by use of the aforementioned semiconductor materials. Subsequently, p-side annealing processing is applied to the p-side semiconductor layer 12p.

Forming N-Side Semiconductor Layer Exposure

In the case where the semiconductor stacked body 12 is formed, in the partial area of the surface of the semiconductor stacked body 12, the whole of the p-side semiconductor layer 12p and the active layer 12a and part of the n-side semiconductor layer 12n are removed from the upper surface side by etching, and the stepped portion 12b on which the n-side semiconductor layer 12n is exposed to the bottom surface is formed.

Forming Insulation Film

Next, on the upper surface of the p-side semiconductor layer 12p, the insulation film 15 is formed by use of insulation materials such as $SiO_2$ by a sputtering method in an area where the p-side pad electrode 142 is provided, and its neighborhood area.

Forming Light Transmissive Electrode

Subsequently, the light transmissive electrode 141 is formed by use of light transmissive conductive materials such as ITO by the sputtering method in such a manner as to cover an approximately entire upper surface of the p-side semiconductor layer 12p.

Forming P-Side Pad Electrode

Furthermore, the pad electrode 142 is formed by use of metal materials such as Cu and Au on part of the upper surface of the light transmissive electrode 141 by the sputtering method, thereby forming the p-side electrode 14.

Forming N-Side Pad Electrode

Also, in the stepped portion 12b, the light reflection film 131 is formed by use of metal materials having good light reflectivity such as Al by the sputtering method, and further the pad electrode 132 is formed by use of metal materials such as Cu and Au by the sputtering method on the upper surface of the light reflection film 131, thereby forming the n-side electrode 13. It is noted that any of the n-side electrode 13 and the p-side electrode 14 may be primarily formed, and part of the sub-process, for example, the pad electrode 132 and the pad electrode 142 may be formed in the same process.

Forming Protective Film

Next, the protective film 16 is formed that covers the whole of the wafer, by use of insulation materials having light transmissivity such as SiO$_2$ by the sputtering method in such a manner as to include the opening portions 16n and 16p in an area for connecting the outer portion of the upper surfaces of the pad electrode 132 and the pad electrode 142.

It is noted that mask having an appropriate shape is formed on respective layers of the n-side electrode 13 and the p-side electrode 14, the insulation film 15, and the protective film 16 by a photolithography method, and patterns are formed by an etching method or a lift-off method using the mask. As illustrated in FIG. 7B, the light-emitting elements 1 in a wafer state can be formed by performing the aforementioned sub-processes.

Forming Individually Separated Pieces

Next, the wafer is cut along the boundary line BD, thereby individually separating the wafer into the light-emitting elements 1. The external shape of the light-emitting element 1 is formed in a triangle, and in the case where the plurality of light-emitting elements 1 are formed on a sheet of wafer, the wafer can be densely partitioned, and the wafer can be individually separated only by linear cutting by use of a dicing method using a dicing saw or a scribe method. Also, it may be such that the back surface of the substrate 11 is polished, and its thickness is reduced before the wafer is cut. Accordingly, the wafer can be easily cut.

In the case where the external shape of the light-emitting element 1 is formed in a trapezoid, as is the same with the triangle, the wafer can be densely partitioned and individually separated only by the linear cutting. Also, in the case of a pentagon or hexagon, there is a case where the wafer cannot be individually separated only by the linear cutting when an area is partitioned with good use efficiency. In this case, the wafer can be individually separated by a laser dicing method, which enables cutting in a zigzag line. The laser dicing method is a method that laser light (preferably, femtosecond pulse laser light) is irradiated in such a manner as to condense the light into the interior of the substrate 11, and the substrate 11 in the vicinity of a focal point is changed in quality, thereby forming cutting grooves. The laser light is irradiated to the substrate 11 along the boundary line BD, thereby forming zigzag-line cutting grooves in the interior of the substrate 11. Subsequently, stress is applied to the substrate 11, for example, by use of a roller, so that the wafer can be individually separated, starting from the cutting grooves formed along the boundary line BD. It is noted that a method of cutting the wafer into a non-rectangular shape by the laser dicing method is, for example, described in detail in Japanese Unexamined Patent Application Publication No. 2006-135309 A, and therefore further description is omitted.

The package preparatory process S102 is a process of preparing the package 2 in the light-emitting device 100 illustrated in FIGS. 1 to 3B. The package 2 prepared in this process is brought into a state where the light-emitting element 1 is not mounted, and the sealing resin 3 is not provided. In the package preparatory process S102, the package may be manufactured by molding methods in which a mold is used, for example, such as a transfer molding method, an injection molding method, a compression molding method, and an extrusion molding method or a commercial package may be obtained so as to prepare the package 2. It is noted that any of the light-emitting-element preparatory process S101 and the package preparatory process S102 may be primarily performed or both of the processes S101 and S102 may be concurrently performed.

The example of the manufacturing method of the package 2 will be described. The package 2 can be manufactured such that lead frames (lead electrodes 21 and 22) formed of a steel plate that is punched out and processed are sandwiched between upper and lower molds that include a hollow having a shape of the resin portion 23, and the resin material is injected from a gate hole provided in part of the mold, and the injected mold is removed from the mold after being hardened or solidified. Also, in the case where the plurality of packages 2 are manufactured in a state of being coupled with the lead frames, the packages 2 are individually separated by cutting the lead frames. The manufacturing method using the molds is described in detail, for example, in Japanese Unexamined Patent Application Publication No. 2008-72074 A, and therefore further description is omitted.

The light-emitting-element arrangement process S103 is a process for mounting the light-emitting element 1 prepared in the light-emitting-element preparatory process S101 on the concave portion 23a of the package 2 prepared in the package preparatory process S102. More specifically, the light-emitting-element arrangement process S103 includes, as a sub-process, a light-emitting-element bonding process S201, a wiring process S202, and a sealing process S203.

First, in the light-emitting element bonding process S201, the light-emitting element 1 is bonded to the upper surface of the internal lead portion 21a, which is the bottom surface 23b of the concave portion 23a of the package 2, by use of the die bond resin 5 (preferably, silicone based die bond resin). In this time, an appropriate amount of die bond resin 5 is supplied to a bonding position on the upper surface of the internal lead portion 21a by use of a dispenser or pin transfer. Then, the light-emitting element 1 is transferred to the bonding position, on which the die bond resin 5 is arranged, by use of a collet while the surface, on which the n-side electrode 13 and the p-side electrode 14 are provided, is directed upward, and the base of the triangle of the external shape in the longitudinal direction of the light-emitting element 1 is parallel to the longitudinal direction of the bottom surface 23b of the concave portion 23a, and the surface on the side of the substrate 11 and the upper surface of the internal lead portion 21a are bonded while the vertex opposite to the base of the triangle is directed opposite to the upper side of the bottom surface 23b.

Next, in the wiring process S202, the wires 4 are laid in such a manner that the n-side electrode 13 and the p-side electrode 14 of the light-emitting element 1 are electrically connected to the internal lead portions 21a and 22a of the lead electrodes 21 and 22 corresponding to each polarity. The wires 4 can be laid by use of a wire bonding device.

Next, in the sealing process S203, the liquid sealing resin 3 is filled in the concave portion 23a of the package 2 by a potting method, and subsequently, the light-emitting element 1 is sealed by hardening the sealing resin 3. The sealing resin 3 may contain the particles of the phosphor (the matter of wavelength conversion) or the particles of the matter of light diffusion in the resin having light transmissivity. The light-emitting device 100 can be manufactured through the aforementioned procedure.

Modification

Figure 9A:
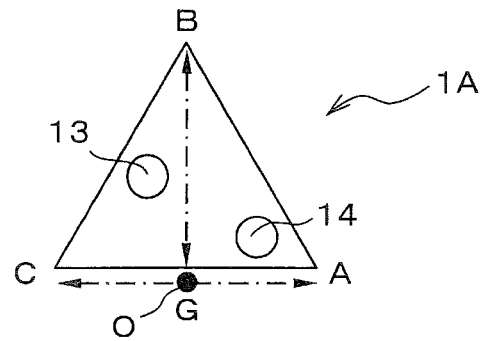
FIG. 9A is a schematic plan view illustrating another example of the light-emitting element used for the light-emitting device according to the first embodiment.
Figure 9B:
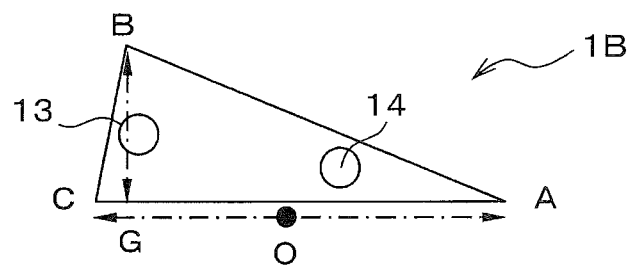
FIG. 9B is a schematic plan view illustrating another example of the light-emitting element used for the light-emitting device according to the first embodiment.
Figure 9C:
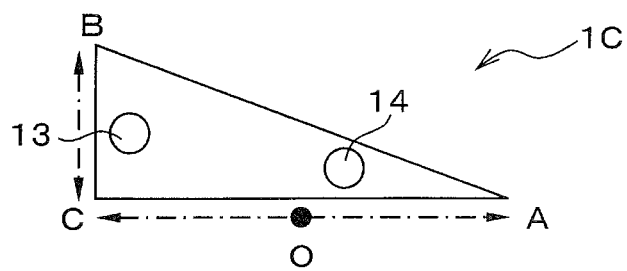
FIG. 9C is a schematic plan view illustrating another example of the light-emitting element used for the light-emitting device according to the first embodiment.
Figure 9D:
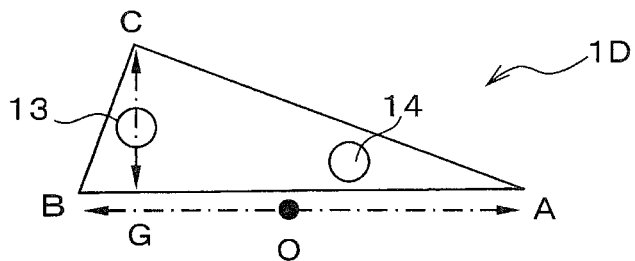
FIG. 9D is a schematic plan view illustrating another example of the light-emitting element used for the light-emitting device according to the first embodiment.
Figure 9E:
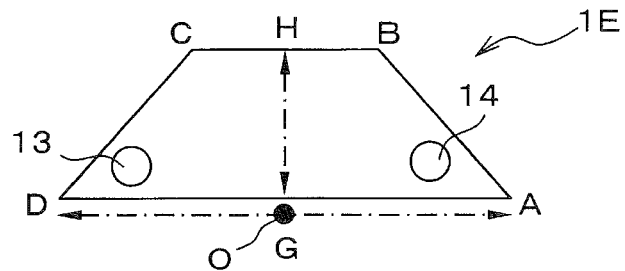
FIG. 9E is a schematic plan view illustrating another example of the light-emitting element used for the light-emitting device according to the first embodiment.
Figure 9F:
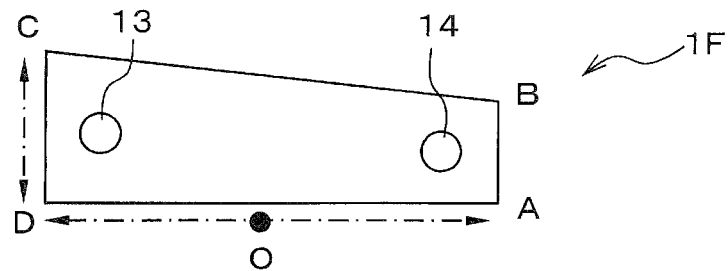
FIG. 9F is a schematic plan view illustrating another example of the light-emitting element used for the light-emitting device according to the first embodiment.
Figure 9G:
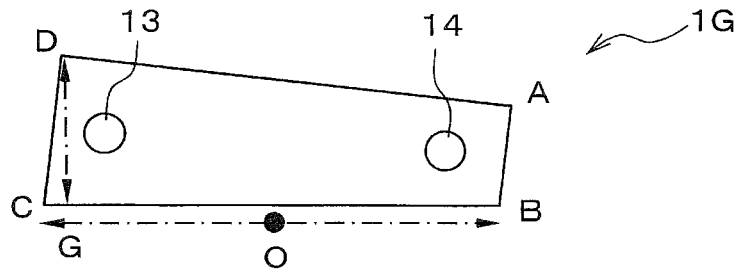
FIG. 9G is a schematic plan view illustrating another example of the light-emitting element used for the light-emitting device according to the first embodiment.
Figure 9H:
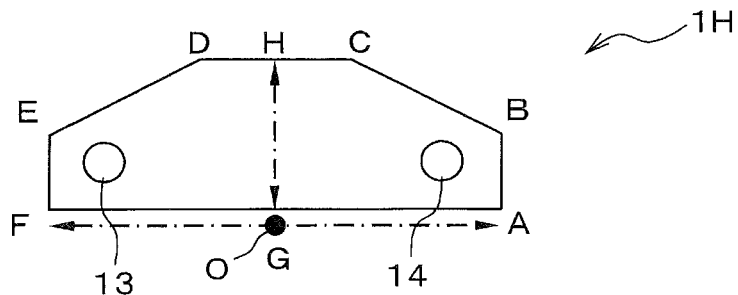
FIG. 9H is a schematic plan view illustrating another example of the light-emitting element used for the light-emitting device according to the first embodiment.
Figure 9I:
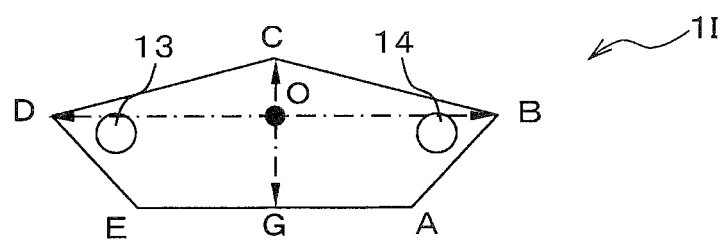
FIG. 9I is a schematic plan view illustrating another example of the light-emitting element used for the light-emitting device according to the first embodiment.
Figure 9J:
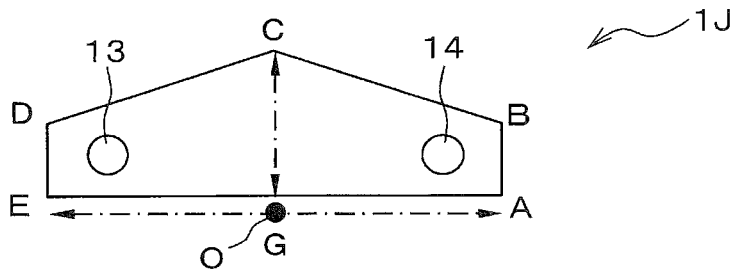
FIG. 9J is a schematic plan view illustrating another example of the light-emitting element used for the light-emitting device according to the first embodiment.

Next, the modification of the light-emitting element 1 mounted on the light-emitting device 100 according to the first embodiment will be described referring to FIGS. 9A to 9J. FIG. 9A is a schematic plan view illustrating another example of the light-emitting element used for the light-emitting device according to the first embodiment. FIG. 9B is a schematic plan view illustrating another example of the light-emitting element used for the light-emitting device according to the first embodiment. FIG. 9C is a schematic plan view illustrating another example of the light-emitting element used for the light-emitting device according to the first embodiment. FIG. 9D is a schematic plan view illustrating another example of the light-emitting element used for the light-emitting device according to the first embodiment. FIG. 9E is a schematic plan view illustrating another example of the light-emitting element used for the light-emitting device according to the first embodiment. FIG. 9F is a schematic plan view illustrating another example of the light-emitting element used for the light-emitting device according to the first embodiment. FIG. 9G is a schematic plan view illustrating another example of the light-emitting element used for the light-emitting device according to the first embodiment. FIG. 9H is a schematic plan view illustrating another example of the light-emitting element used for the light-emitting device according to the first embodiment. FIG. 9I is a schematic plan view illustrating another example of the light-emitting element used for the light-emitting device according to the first embodiment. FIG. 9J is a schematic plan view illustrating another example of the light-emitting element used for the light-emitting device according to the first embodiment.

It is noted that, in respective light-emitting elements 1A to 1J according to the modification in FIGS. 9A to 9J, only the external shape in the case of being viewed from a plane and an area for connecting the outside of the pad electrodes as the n-side electrode 13 and the p-side electrode 14 are illustrated, and the illustration of other detailed constitution is omitted. The vertices of a polygon, which is the external shape in the case of being viewed from a plane, are appropriately represented as "A to F", and the center in the longitudinal direction of the external shape is represented as "O". As illustrated in a dot and dash line in each drawing, the light-emitting elements 1A to 1J are illustrated such that the horizontal direction is the longitudinal direction, and the vertical direction is the lateral direction. Accordingly, the light-emitting elements 1A to 1J are arranged on the bottom surface 23b in such a manner that each horizontal direction is parallel to the longitudinal direction of the bottom surface 23b of the concave portion 23a of the package 2.

The light-emitting elements 1A to 1D are represented as another example in which the external shape is a triangle. The light-emitting elements 1E to 1G are represented as the example in which the external shape is a trapezoid. The light-emitting element 1H is represented as the example in which the external shape is a hexagon. The light-emitting elements 1I and 1J are represented as the example in which the external shape is a pentagon. Also, any of the light-emitting elements 1E to 1J are a convex polygon. Furthermore, any of the external shape of the light-emitting elements 1A to 1J is formed in a horizontally extended long shape in which a length in the horizontal direction is longer than a length in the vertical direction.

The external shape of the light-emitting element 1A is an equilateral triangle. In the light-emitting element 1A, one side CA is represented as the longitudinal direction, and the direction of a perpendicular line BG dropped from a vertex B to the side CA is represented as the lateral direction. The light-emitting elements, inclusive of the case where the external shape is an equilateral triangle as the light-emitting element 1A, can be used such that a side that is not the shortest side out of the three sides of the triangle as the external shape is the base, and the base is parallel to the horizontal direction and directed downward. Accordingly, the light-emitting element 1A whose external shape is a triangle can be used as the light-emitting element formed in a horizontally extended shape. The same is applied to the light-emitting elements 1B to 1D described below.

The light-emitting element 1B is an acute isosceles triangle, whose external shape is such that the lengths of a side AB and a side CA are equal, and an interior angle at a vertex A is less than 90 degrees. The light-emitting element 1B is such that the side CA, which is one of the long sides, is the longitudinal direction, and a perpendicular line BG dropped from the vertex B to the side CA is the lateral direction.

The light-emitting element 1C is a right-angled triangle, whose external shape is such that an interior angle at a vertex C is a right angle, and a side CA is longer than a side BC. The light-emitting element 1C is such that the side CA, which is a long side out of the two sides forming the right-angled interior angle, is the longitudinal direction, and the side BC is the lateral direction. It is noted that a right-angled isosceles triangle, of which the lengths of the side BC and a side AC are equal, may be applied.

The light-emitting element 1D is a right-angled triangle, whose external shape is congruent to the external shape of the light-emitting element 1C, but an oblique side AB is the longitudinal direction, and a perpendicular line CG dropped from a vertex C to the side AB is the lateral direction.

The light-emitting element 1E is an isosceles trapezoid, whose external shape is such that a side BC is an upper base, and a side DA is a lower base, and the lengths of a leg AB and a leg CD are equal. The light-emitting element 1E is such that the lower base DA is the longitudinal direction, and a perpendicular line HG dropped from a point H on the upper base BC to the lower base DA is the lateral direction. Also, in the case where the external shape is a trapezoid, it is not limited that the lower base of the trapezoid is parallel to the longitudinal direction, but the longest side or its opposite side out of the four sides of the trapezoid may be in the longitudinal direction, which provides the horizontally extended light-emitting element. The light-emitting elements 1F and 1G described below are examples where the leg of the trapezoid is disposed in the longitudinal direction.

The light-emitting element 1F is a trapezoid, whose external shape is such that a side AB and a side CD are parallel to each other, and interior angles at vertices A and D are a right angle. The light-emitting element 1F is such that a side DA is the longitudinal direction, and the side CD is the lateral direction. It is noted that the right angles are not necessarily formed at the vertices A and D, but forming the right angles allows the light-emitting element 1F to be arranged with good use efficiency in terms of the area of the bottom surface 23b, which is an installation area.

The light-emitting element 1G is a trapezoid, whose external shape is similar to that of the light-emitting element 1F, but a side BC is the longitudinal direction, and a perpendicular line DG dropped from a point D to the BC is the lateral direction.

The light-emitting element 1H is such that the external shape is a hexagon, and a side CD and a side FA, which is a pair of opposite sides, are parallel to each other, and the side CD is shorter than the side FA, and interior angles at the vertices A and F are a right angle. In other words, the external shape of the light-emitting element 1H is a hexagon formed in such a manner that two upper corners are chamfered from a horizontally extended rectangular shape. The light-emitting element 1H is such that the side FA is the longitudinal direction, and a perpendicular line HG dropped from a point H on a side DC to the side FA is the lateral direction. It is noted that the right angles are not necessarily formed at the vertices A and F, but forming the right angles allows the light-emitting element 1H to be arranged with good use efficiency in terms of the area of an installation area.

The light-emitting element 1I is formed in a horizontally extended pentagon whose external shape is arranged such that a side EA, which is one side of a regular pentagon, is disposed downward and parallel to the horizontal direction, and further the entire shape is extended in the horizontal direction. The light-emitting element 1I is such that a diagonal line BD parallel to the side EA is the longitudinal direction, and a perpendicular line CG dropped from a point C to the side EA is the lateral direction.

The light-emitting element 1J is formed in a pentagon, whose external shape is such that one side EA is longer than other sides, and the lengths of a side BC and a side CD, which are two sides opposite to the side EA, are equal, and interior angles at the vertices A and E are a right angle. The light-emitting element 1J is such that the EA is the longitudinal direction, and the perpendicular line CG dropped from the point C to the side EA is the lateral direction. In other words, the light-emitting element 1J is deformed in such a manner that the interior angles at the vertices A and E are formed in a right angle, with regard to the external shape of the light-emitting element H. Forming the right angles at the vertices A and E allows the light-emitting element 1J to be arranged with good use efficiency in terms of the area of an installation area.

It is noted that the symmetry of the external shape of the light-emitting elements 1A to 1J is not particularly limited, but it is preferable that the light-emitting elements have bilateral symmetry in the case of being arranged on the bottom surface 23b, as the light-emitting elements 1A, 1E, 1H, 1I, and 1J. The light-emitting elements 1A, 1E, 1H, 1I, and 1J are mounted, so that light distribution properties in the horizontal direction of the light-emitting device 100 can be bilaterally symmetrical.

Also, it is preferable that one of a pair of pad electrodes of the light-emitting elements 1A to 1J be provided in the vicinity of one end in the longitudinal direction of the external shape of the light-emitting elements 1A to 1J, and the other of the pair of pad electrodes be provided in the vicinity of the other end in the longitudinal direction. In this manner, the wires 4 between the light-emitting elements 1A to 1J and the internal lead portions 21a and 22a, and/or the wires 4 for connecting the light-emitting elements 1A to 1J themselves can be shortened, and further wiring can be laid in such a manner that the light emitted from the light-emitting elements 1A to 1J is not blocked by the wires 4 in a broad range. Accordingly, the light absorption by the wires 4 can be reduced, so that the light from the light-emitting elements 1A to 1J and the matter of wavelength conversion can be efficiently emitted to the outside. As a result, the output and the efficiency of light extraction of light-emitting device in which these light-emitting elements 1A to 1J are mounted can be improved. It is not limited that the pair of pad electrodes, for example, as the light-emitting element 1E, is provided on the straight line parallel to the longitudinal direction of the external shape. For example, as the light-emitting element 1A, the pair of pad electrodes may be provided in such a manner that its position is shifted in the vertical direction. Also, in the case where the positions of the pair of pad electrodes are shifted in the vertical direction, and the pair of pad electrodes is arranged, it is preferable that the pair of pad electrodes be provided in the vicinity of the sides of the external shape.

Condition of External Shape of Light-Emitting Element

Figure 10A:
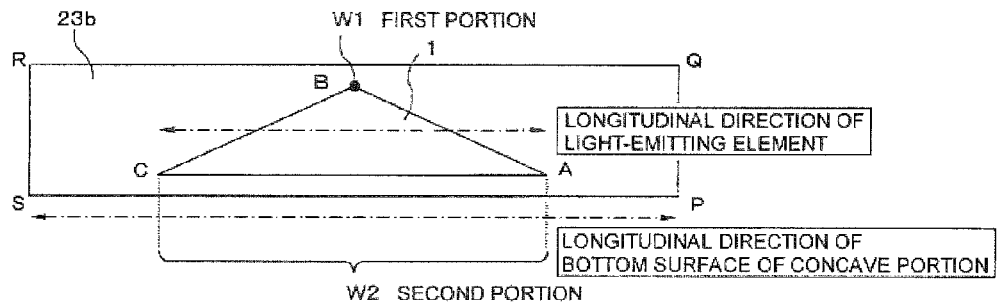
FIG. 10A is a schematic front view to describe the arrangement of the light-emitting element whose external shape is a triangle, in the light-emitting device according to the first embodiment.
Figure 10B:
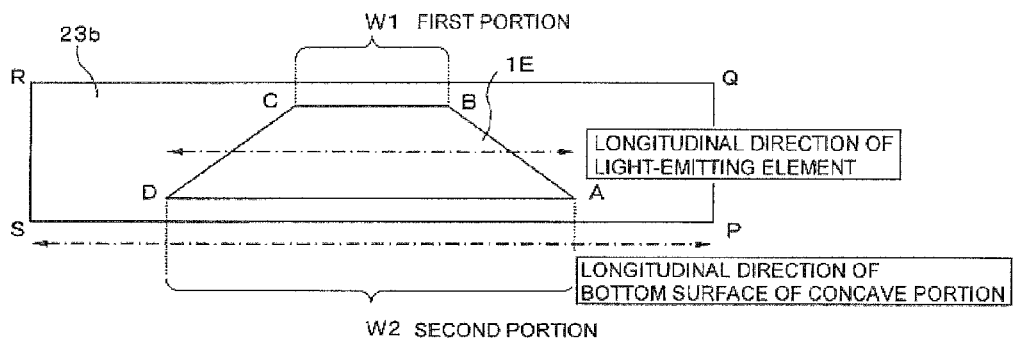
FIG. 10B is a schematic front view to describe the arrangement of the light-emitting element whose external shape is a trapezoid, in the light-emitting device according to the modification of the first embodiment.

Herein, the condition for the external shape and arrangement direction on the bottom surface 23b, in the case where the light-emitting elements 1 to 1J having polygonal external shapes illustrated in FIGS. 4C, 9A to 9J are viewed from a plane, will be described further in detail referring to FIGS. 10A and 10B, which are exemplified by the light-emitting elements 1 and 1E. FIG. 10A is a schematic front view to describe the arrangement of the light-emitting element whose external shape is a triangle, in the light-emitting device according to the first embodiment. FIG. 10B is a schematic front view to describe the arrangement of the light-emitting element whose external shape is a trapezoid, in the light-emitting device according to the modification of the first embodiment. Also, in FIGS. 10A and 10B, the vertices of the external shape of the light-emitting elements 1 and 1E are represented by A to D, and the shape of the bottom surface 23b of the concave portion 23a is simplified into a horizontally extended rectangle, and the vertices of the rectangle are represented by P to S. Accordingly, an upper side QR of the bottom surface 23b and a lower side SP of the bottom surface 23b are parallel to the longitudinal direction of the bottom surface 23b.

Any of the light-emitting elements 1 to 1J described in the first embodiment and its modification are arranged in such a manner that the longitudinal direction of the external shape is parallel to the longitudinal direction of the bottom surface 23b. Accordingly, the longitudinal direction of the external shape of the light-emitting elements 1 to 1J is parallel to the upper side QR and the lower side SP. Also, on the outline illustrating the external shape of the light-emitting elements 1A to 1J, a portion of the outline opposed in parallel to the upper side QR is represented as a first portion (a first outer peripheral portion) W1, and a portion of the outline opposed in parallel to the lower side SP is represented as a second portion (a second outer peripheral portion) W2. In other words, the first portion W1 is the portion of the outline abutted to the upper side QR, and the second portion W2 is the portion of the outline abutted to the lower side SP.

In the light-emitting element 1 whose external shape is a triangle, any of the side AB and the side BC is opposed in non-parallel to the upper side QR. Accordingly, a portion abutted to the upper side QR is only the vertex B. Consequently, in this case, the vertex B corresponds to the first portion W1. Also, the base CA of the triangle is opposed in parallel to the lower side SP. Accordingly, a portion abutted to the lower side SP is the base CA. Consequently, in this case, the base CA corresponds to the second portion W2.

In the light-emitting element 1E whose external shape is a trapezoid, the upper base BC of the trapezoid is opposed in parallel to the upper side QR, and a leg AB and a leg CD are opposed in non-parallel to the upper side QR. Accordingly, a portion abutted to the upper side QR is the upper base BC. Consequently, in this case, the upper base BC corresponds to the first portion W1. Also, the lower base DA of the trapezoid is opposed in parallel to the lower side SP. Accordingly, a portion abutted to the lower side SP is the lower base DA. Consequently, in this case, the lower base DA corresponds to the second portion W2.

Also, as the light-emitting element 1H (see FIG. 9H), on the outline, a side vertical to the longitudinal direction of the bottom surface 23b is regarded as a portion that is not opposed to any the upper side QR and the lower side SP. Accordingly, in the light-emitting element 1H, the side CD opposed in parallel to the upper side QR is the first portion W1, and the side FA opposed in parallel to the lower side SP is the second portion W2.

It is noted that, in the case where the outline opposite to the lower side SP is slightly deviated from the parallel to the lower side SP in the case of arranging any of the light-emitting elements 1 to 1J on the bottom surface 23b, or in the case where the portion of the outline opposite to the lower side SP includes a vertex whose interior angle is near to 180 degrees, a side, of which the inclined angle to the lower side SP is the minimum, corresponds to a side abutted closest to the lower side SP. Accordingly, in this case, out of the sides opposite to the lower side SP, a side of which the inclined angle to the lower side SP is the minimum corresponds to the second portion W2.

As for other light-emitting elements 1A to 1D and 1F to 1J, as is the same with the description of the light-emitting elements 1 and 1E, the first portion W1 and the second portion W2 can be defined. In any of the light-emitting elements 1 to 1J, the light-emitting elements 1 to 1J are arranged on the bottom surface 23b in such a manner that the length of the first portion W1 is shorter than the length of the second portion W2. Accordingly, in any case of the light-emitting elements 1 to 1J, the irradiation intensity of the light emitted from the lateral surface of the light-emitting elements 1 to 1J with respect to the upper wall portion 23c is reduced, compared with the irradiation intensity of the light with respect to the lower wall portion 23d. Then, the deterioration of the upper wall portion 23c due to the light irradiation can be suppressed, and the occurrence of cracks can be prevented. As a result, the life of the light-emitting device 100, in which the light-emitting elements 1 to 1J are mounted, can be prolonged. Also, in place of, or in addition to the prolongation of life spans, an increase in power output of the light-emitting device 100 can be achieved.

Second Embodiment

Figure 11:
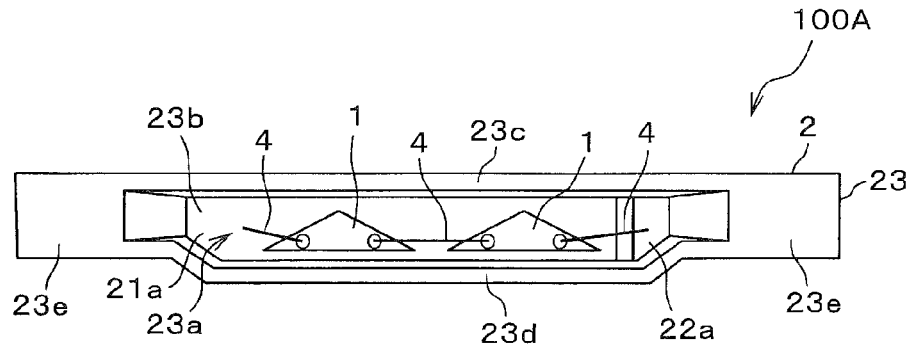
FIG. 11 is a schematic front view illustrating the constitution of the light-emitting device according to a second embodiment.

Next, the light-emitting device according to a second embodiment will be described referring to FIG. 11. FIG. 11 is a schematic front view illustrating the constitution of the light-emitting device according to the second embodiment. It is noted that the illustration of the external lead portions and the sealing resin is omitted in FIG. 11.

A light-emitting device 100A according to the second embodiment is provided in such a manner that the plurality (two in the present embodiment) of light-emitting elements 1 are arranged in a row in the longitudinal direction on the bottom surface 23b of the concave portion 23a of the package 2. Each light-emitting element 1 has the same shape as that of the light-emitting element 1 of the light-emitting device 100 according to the first embodiment, and the light-emitting element 1 is arranged in such a manner that the base of the horizontally extended triangle in the longitudinal direction is parallel to the longitudinal direction of the bottom surface 23b of the concave portion 23a of the package 2, and a vertex opposite to the base of the triangle is opposite to the upper side of the bottom surface 23b. Accordingly, in the inner side surface of the upper wall portion 23c and the lower wall portion 23d that sandwich the light-emitting elements 1 in the height direction (the vertical direction in FIG. 11), the irradiation intensity of the light emitted from the light-emitting element 1 is reduced with respect to the upper wall portion 23c in which cracks are likely to occur due to internal stress generated after mounting, and the deterioration of the upper wall portion 23c can be suppressed. Also, the light-emitting elements 1 abutted to each other in the horizontal direction are configured such that the corner of the triangle of the external shape of one light-emitting element is opposite to the corner of the triangle of the external shape of the other light-emitting element in the case of being viewed from the front, and that the lateral surfaces are opposed in non-parallel to each other, so that the amount of light, which is emitted from one light-emitting element 1 and incident on the lateral surface of the other light-emitting element 1, is reduced, which improves the efficiency of light extraction from the light-emitting device 100A.

Also, the two light-emitting elements 1 are electrically connected to the internal lead portions 21a and 22a in series by use of the wires 4. In this time, it is preferable that both polarities of the pad electrodes of the light-emitting element 1 be provided in the vicinity of each end portion in the longitudinal direction. Accordingly, the wires 4 that connect between the light-emitting elements 1, and between the light-emitting elements 1 and the internal lead portions 21a and 22a can be shortened, and a range that the wires 4 cover the light extraction direction (direction of the opening surface of the concave portion 23a) of the light-emitting element 1 can be reduced. Consequently, the amount of light in the light extraction hindered by the wires 4 is reduced, and the efficiency of light extraction from the light-emitting device 100A is improved. The plurality of light-emitting elements 1 are not limited to connection in series, but connection in parallel or other connecting methods may be applied.

It is noted that the light-emitting device 100A can be manufactured in a similar manner as that of the light-emitting device 100 according to the first embodiment, except that the plurality of light-emitting elements 1 are arranged in the concave portion 23a of the package 2. Accordingly, the detailed descriptions of the manufacturing method are omitted.

Third Embodiment

Figure 12:
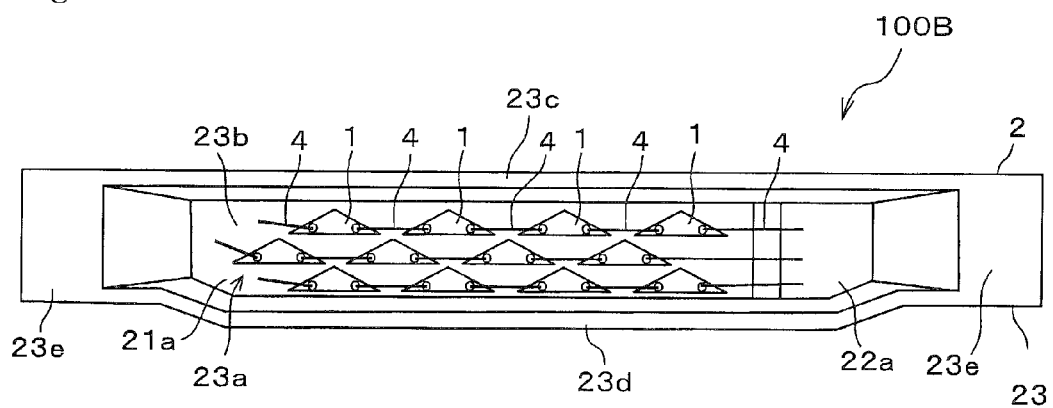
FIG. 12 is a schematic front view illustrating the constitution of the light-emitting device according to a third embodiment.

Next, the light-emitting device according to a third embodiment will be described referring to FIG. 12. FIG. 12 is a schematic front view illustrating the constitution of the light-emitting device according to the third embodiment. It is noted that the illustration of the external lead portions and the sealing resin is omitted in FIG. 12.

A light-emitting device 100B according to the third embodiment is provided as follows: the plurality (twelves in the present embodiment) of light-emitting elements 1 are arranged in such a manner that four light-emitting elements 1 per line are disposed on the bottom surface 23b of the concave portion 23a of the package 2 in the longitudinal direction, and three lines are formed in the lateral direction. Also, the light-emitting elements 1 are electrically connected to the internal lead portions 21a and 22a in series by use of the wires 4 for each line in the longitudinal direction, that is, every four light-emitting elements.

Each light-emitting element 1 has the same shape as that of the light-emitting element 1 of the light-emitting device 100 according to the first embodiment, and the light-emitting element 1 is arranged in such a manner that the longitudinal direction of the horizontally extended triangle is parallel to the longitudinal direction of the bottom surface 23b of the concave portion 23a of the package 2, and a vertex opposite to the base of the triangle is opposite to the upper side of the bottom surface 23b. Accordingly, in the inner side surface of the upper wall portion 23c and the lower wall portion 23d that sandwich the light-emitting elements 1 in the height direction (the vertical direction in FIG. 12), the irradiation intensity of the light emitted from the light-emitting elements 1 is reduced with respect to the upper wall portion 23c in which cracks are likely to occur due to internal stress generated after mounting, and the deterioration of the upper wall portion 23c can be suppressed.

Also, it is preferable that the installation positions of the light-emitting elements 1 arranged in the three lines be shifted for each line in the horizontal direction of the light-emitting elements 1, that is, arranged in a staggered manner. In the case of being viewed from the front, the staggered arrangement allows the width between the outlines of the light-emitting elements 1, which are abutted in the vertical direction, to be reduced. Accordingly, the amount of light, which is emitted from one light-emitting element 1 abutted in the vertical direction and incident on the lateral surface of the other light-emitting element 1, is reduced, which improves the efficiency of light extraction from the light-emitting device 100B.

The light-emitting elements 1 abutted in the horizontal direction are similar to those in the case of the light-emitting device 100A according to the second embodiment, and the re-incidence of light between the light-emitting elements 1 is reduced, and the efficiency of light extraction from the light-emitting device 100B is improved.

As is the same with the light-emitting elements 1 in the light-emitting device 100A according to the second embodiment, it is preferable that both polarities of the pad electrodes of the light-emitting element 1 be provided in the vicinity of each end portion in the longitudinal direction. Also, the plurality of light-emitting elements 1 are not limited to connection in series for each line, but all the light-emitting elements 1 may be connected in series, or all the light-emitting elements 1 may be connected in parallel, or other connecting methods may be applied.

It is noted that the light-emitting device 100B can be manufactured in a similar manner as that of the light-emitting device 100 according to the first embodiment, except that the plurality of light-emitting elements 1 are arranged in the concave portion 23a of the package 2 in plural lines. Accordingly, the detailed descriptions of the manufacturing method are omitted.

Also, in the light-emitting device 100A according to the second embodiment and the light-emitting device 100B according to the third embodiment, in place of the light-emitting element 1, the light-emitting elements 1A to 1J having other external shapes, as illustrated in FIGS. 9A to 9J, can be used.

Applications

Constitution of Lighting Device

Figure 13:
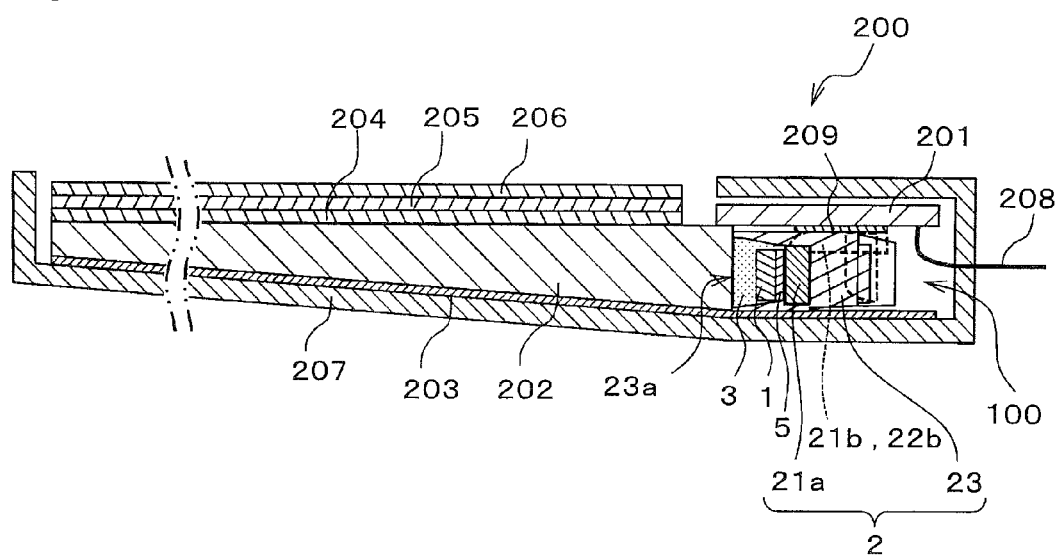
FIG. 13 is a schematic cross-sectional view illustrating the constitution of a lighting device using the light-emitting device according to the first embodiment.

Next, as the applications of the light-emitting devices according to respective embodiments, a lighting device using these light-emitting devices will be described referring to FIG. 13. FIG. 13 is a schematic cross-sectional view illustrating the constitution of the lighting device using the light-emitting device according to the first embodiment. It is noted that the case where the light-emitting device 100 according to the first embodiment is used is described as the application, but the light-emitting devices 100A and 100B according to the second and third embodiments and the light-emitting device according to the modification of the second and third embodiments can be used, in place of the light-emitting device 100.

A lighting device 200 according to the application is a surface-emitting-type light source device suitable for the backlights of a liquid crystal display device. The lighting device 200 includes a mounting substrate 201 on which the light-emitting device 100 is mounted, a tubular light guiding member 202, a light reflection sheet 203 provided on the lower surface side of the light-emitting device 100 and the light guiding member 202, a light diffusion sheet 204 stacked and provided on the upper surface side, which is a light extraction surface of the light guiding member 202, and prism sheets 205 and 206, and the lighting device 200 is stored in a frame 207 that includes an opening on the upper surface, which is the emission direction of illumination light. Also, the wiring patterns of the mounting substrate 201 are connected to an outside power supply via a lead line 208, and the external lead portions 21b and 22b of the light-emitting device 100 are electrically bonded to wiring patterns corresponding to the polarities of the mounting substrate 201 by use of a bonding member 209 having electric conductivity such as solder.

The light guiding member 202 is formed of resin having light transmissivity and has a cross-sectional tapered shape whose thickness is reduced from the end surface (right lateral surface) side of light incidence to the opposite surface (left lateral surface). The end surface of light incidence of the light guiding member 202 is arranged in such a manner as to adhere closely to the opening surface of the concave portion 23a, which is the light emission surface of the light-emitting device 100, and provided in such a manner that the height of the end surface of light incidence approximately corresponds to the height of the light-emitting device 100. The light emitted from the light-emitting device 100 is incident from the end surface of light incidence onto the light guiding member 202 and transmitted in the interior of the light guiding member 202 while being repeatedly reflected and diffused, and emitted from the upper surface side of the light guiding member 202.

Also, the light reflection sheet 203, for example, is formed of resin, on which a reflection film made of Ag or Al is formed on the surface and has a function of enhancing the efficiency of utilization of light by returning light leaked from the light-emitting device 100 or the light guiding member 202 to the aforementioned members. The light diffusion sheet 204 has a function of equalizing the intensity distribution of the light emitted from the upper surface side of the light guiding member 202. The prism sheets 205 and 206 are formed of the resin having light transmissivity, in which many minute triangular prisms are formed on the surface and have a function of condensing the light by refracting the incident light from the lower surface in the direction of the normal to the sheet surface. The prism sheets 205 and 206 are arranged in such a manner that the directions of refracting the light are orthogonal to each other. The frame 207 is formed by folding a board made of Al or stainless steel into a box shape.

The light-emitting device 100, as described above, is configured such that the resin material of the package 2 is not easily deteriorated by the light from the light-emitting element 1, so that high efficiency and prolongation of life spans can be achieved. Accordingly, the lighting device 200 using the light-emitting device 100 can serve as the surface-emitting-type light source having high efficiency and prolongation of life spans.

As described above, the light-emitting device according to the embodiments of the present invention has been specifically described. However, the gist of the present invention is not limited to the descriptions but needs to be interpreted broadly based on Claims. Also, needless to say, the gist of the present invention includes various changes and modifications based on the descriptions.

The light-emitting device according to the embodiments of the aforementioned disclosure can be utilized for various light sources such as light sources for the backlight of the liquid crystal display, various lighting apparatuses, large-size displays, various display devices for advertisements or destination guide, image reading devices such as digital video cameras, facsimile machines, copying machines, and scanners, and projector devices.

A light-emitting device according to the embodiment of the disclosure may include a package of which a bottom surface is formed in a long shape, the package configured to be open to a front direction vertical to the bottom surface and include a concave portion whose inner wall surrounding the bottom surface is made of resin as a main ingredient, and a light-emitting element configured to be arranged on the bottom surface of the concave portion and have a long polygonal shape in a case of being viewed from a front, in which all interior angles are 180 degrees or less, and in a case where a lateral direction of the bottom surface of the concave portion is a vertical direction, and a longitudinal direction of the bottom surface of the concave portion is a horizontal direction, and an outer surface in a downward direction of the package is a mounting surface, the light-emitting element is arranged in such a manner that the longitudinal direction of the light-emitting element is approximately parallel to the horizontal direction, and a first portion of the light-emitting element abutted to an upper side of the bottom surface of the concave portion is shorter than a second portion of the light-emitting element abutted to a lower side of the bottom surface of the concave portion in the case of being viewed from the front.

Obviously, numerous modifications and variations of the present invention are possible in light of the above teachings. It is therefore to be understood that within the scope of the appended claims, the invention may be practiced otherwise than as specifically described herein.

The invention claimed is:

1. A light-emitting device comprising:
a package including a concave portion which has a bottom surface, an opening on a front side opposite to the bottom surface in a front direction vertical to the bottom surface, and an inner peripheral wall connecting the bottom surface and the front side, the bottom surface comprising:
sides;
package distances between opposite sides among the sides;
a longest package distance among the package distances;
a mounting wall via which the light-emitting device is mounted;
a lower side among the sides which defines a part of the mounting wall; and
an upper side among the sides opposite to the lower side; and
at least one light-emitting element arranged on the bottom surface of the concave portion and having a polygonal shape viewed along the front direction, each interior angle of the polygonal shape being less than 180 degrees, the polygonal shape having light-emitting element distances between vertexes of the polygonal shape and having a longest light-emitting element distance among the light-emitting element distances, the at least one light-emitting element being arranged such that a light-emitting element lateral line along the longest light-emitting element distance is substantially parallel to a package lateral line along the longest package distance and such that a first outer peripheral portion of the at least one light-emitting element which is closest to the upper side of the concave portion is shorter than a length of a side, of which inclination to the package lateral line is minimum, out of sides of the at least one light-emitting element on a lower-side side of the concave portion viewed along the front direction.

2. The light-emitting device according to claim 1, wherein the inner peripheral wall is made of resin as a main ingredient.

3. A light-emitting device comprising:
a package including a concave portion which has a bottom surface, an opening on a front side opposite to the bottom surface in a front direction vertical to the bottom surface, and an inner peripheral wall connecting the bottom surface and the front side, the bottom surface comprising:
sides;
package distances between opposite sides among the sides;
a longest package distance among the package distances;
a mounting wall via which the light-emitting device is mounted;
a lower side among the sides which defines a part of the mounting wall; and
an upper side among the sides opposite to the lower side; and
at least one light-emitting element arranged on the bottom surface of the concave portion and having a polygonal shape viewed along the front direction, each interior angle of the polygonal shape being less than 180 degrees, the polygonal shape having light-emitting element distances between vertexes of the polygonal shape and having a longest light-emitting element distance among the light-emitting element distances, the at least one light-emitting element being arranged such that a light-emitting element lateral line along the longest light-emitting element distance is substantially parallel to a package lateral line along the longest package distance and such that a first outer peripheral portion of the at least one light-emitting element which is closest to the upper side of the concave portion is shorter than a second outer peripheral portion of the at least one light-emitting element which is closest to the lower side of the concave portion viewed along the front direction.

4. The light-emitting device according to claim 3, wherein when viewed along the front direction, a distance between the upper side of the bottom surface of the concave portion and the first outer peripheral portion of the at least one light-emitting element is equal to a distance between the lower side of the bottom surface of the concave portion and the second outer peripheral portion of the at least one light-emitting element.

5. The light-emitting device according to claim 3,
wherein the at least one light-emitting element comprises a plurality of light-emitting elements, and
wherein the plurality of light-emitting elements are arranged in one row, or two rows or more in the package lateral line.

6. The light-emitting device according to claim 3,
wherein the at least one light-emitting element is mounted via the mounting wall with solder.

7. The light-emitting device according to claim 3, wherein the inner peripheral wall is made of resin as a main ingredient.

8. The light-emitting device according to claim 3,
wherein a shape of the at least one light-emitting element viewed along the front direction is a trapezoid, and
wherein the at least one light-emitting element is arranged such that a longest side of the trapezoid or an opposite side of the longest side is substantially parallel to the package lateral line.

9. The light-emitting device according to claim 8,
wherein the trapezoid is arranged such that two base angles of the trapezoid are equal, and a base of the trapezoid is substantially parallel to the package lateral line.

10. The light-emitting device according to claim 3,
wherein the at least one light-emitting element is bonded to the bottom surface of the concave portion with a die bond resin including silicone.

11. The light-emitting device according to claim 10,
wherein, further, the at least one light-emitting element is sealed with a sealing resin, and
wherein a refractive index of the die bond resin is equal to or less than a refractive index of the sealing resin.

12. The light-emitting device according to claim 3,
wherein a shape of the at least one light-emitting element viewed along the front direction is a triangle, and
wherein the triangle has a side which is at least not shortest and which is a base, and the at least one light-emitting element is arranged such that the base is substantially parallel to the package lateral line and such that the base is directed toward the lower side of the concave portion.

13. The light-emitting device according to claim 12,
wherein the triangle is a right-angled triangle.

14. The light-emitting device according to claim 12,
wherein a first electrode to connect with an outside is provided at one end of the base, and a second electrode to connect with the outside is provided at another end of the base.

15. The light-emitting device according to claim 12,
wherein the triangle is an obtuse triangle, and an opposite side of an interior angle having an obtuse angle of the obtuse triangle is the base.

16. The light-emitting device according to claim 15,
wherein the triangle is an isosceles triangle.

* * * * *